(12) United States Patent
Jones-Albertus et al.

(10) Patent No.: US 8,697,481 B2
(45) Date of Patent: Apr. 15, 2014

(54) HIGH EFFICIENCY MULTIJUNCTION SOLAR CELLS

(71) Applicant: Solar Junction Corporation, San Jose, CA (US)

(72) Inventors: Rebecca Elizabeth Jones-Albertus, Mountain View, CA (US); Pranob Misra, Santa Clara, CA (US); Michael J. Sheldon, Cortaro, AZ (US); Homan B. Yuen, Santa Clara, CA (US); Ting Liu, San Jose, CA (US); Daniel Derkacs, Sunnyvale, CA (US); Vijit Sabnis, Cupertino, CA (US); Micahel West Wiemer, Campbell, CA (US); Ferran Suarez, San Jose, CA (US)

(73) Assignee: Solar Junction Corporation, San Jose, CA (US)

( * ) Notice: Subject to any disclaimer, the term of this patent is extended or adjusted under 35 U.S.C. 154(b) by 0 days.

(21) Appl. No.: 13/708,763

(22) Filed: Dec. 7, 2012

(65) Prior Publication Data

US 2013/0122638 A1 May 16, 2013

Related U.S. Application Data

(63) Continuation of application No. 13/678,389, filed on Nov. 15, 2012.

(60) Provisional application No. 61/559,982, filed on Nov. 15, 2011.

(51) Int. Cl.
| | |
|---|---|
| *H01L 31/0687* | (2012.01) |
| *H01L 31/0725* | (2012.01) |
| *H01L 31/18* | (2006.01) |
| *H01L 31/0304* | (2006.01) |
| *H01L 31/06* | (2012.01) |
| *H01L 31/0693* | (2012.01) |
| *H01L 31/078* | (2012.01) |

(52) U.S. Cl.
USPC ............... 438/94; 438/47; 438/74; 438/478; 438/172; 438/235; 257/79; 257/90; 257/E31.022; 257/E31.001; 257/E31.02; 136/255; 420/580

(58) Field of Classification Search
CPC ... H01L 31/06; H01L 31/078; H01L 31/1852; H01L 31/0687; H01L 31/0693; H01L 31/1848; H01L 31/1856; H01L 31/0304; H01L 31/0725; H01L 31/1844
USPC ............ 438/57, 94, 478; 257/79, 87–88, 101, 257/E31.022, E31.014, E31.02, E31.001; 136/255; 420/580
See application file for complete search history.

(56) References Cited

U.S. PATENT DOCUMENTS 4,404,421 A 9/1983 Fraas
(Continued)

FOREIGN PATENT DOCUMENTS

JP 63100781 A 5/1988
(Continued)

OTHER PUBLICATIONS

Bank, et al., "Molecular-beam epitaxy growth of low-threshold cw GaInNAsSb lasers at 1.5 um," pp. 1337-1340, J. Vac. Sci. Technol. B 23(3), May/Jun. 2005.*

(Continued)

*Primary Examiner* — Jarrett Stark
*Assistant Examiner* — Bitew Dinke
(74) *Attorney, Agent, or Firm* — Kilpatrick Townsend & Stockton LLP; Kenneth Allen; William R. Lambert

(57) ABSTRACT

Multijunction solar cells having at least four subcells are disclosed, in which at least one of the subcells comprises a base layer formed of an alloy of one or more elements from group III on the periodic table, nitrogen, arsenic, and at least one element selected from the group consisting of Sb and Bi, and each of the subcells is substantially lattice matched. Methods of manufacturing solar cells and photovoltaic systems comprising at least one of the multijunction solar cells are also disclosed.

22 Claims, 18 Drawing Sheets

(56) References Cited

U.S. PATENT DOCUMENTS

| | | | |
|---|---|---|---|
| 4,881,979 A | 11/1989 | Lewis | |
| 4,935,384 A | 6/1990 | Wanlass | |
| 5,009,719 A | 4/1991 | Yoshida | |
| 5,016,562 A * | 5/1991 | Madan et al. | 118/719 |
| 5,166,761 A | 11/1992 | Olson et al. | |
| 5,223,043 A | 6/1993 | Olson et al. | |
| 5,316,593 A | 5/1994 | Olson et al. | |
| 5,342,453 A | 8/1994 | Olson et al. | |
| 5,376,185 A | 12/1994 | Wanlass | |
| 5,405,453 A | 4/1995 | Ho et al. | |
| 5,689,123 A | 11/1997 | Major et al. | |
| 5,800,630 A * | 9/1998 | Vilela et al. | 136/249 |
| 5,911,839 A | 6/1999 | Tsai et al. | |
| 5,935,345 A | 8/1999 | Kuznicki | |
| 5,944,913 A | 8/1999 | Hou et al. | |
| 6,150,603 A | 11/2000 | Karam et al. | |
| 6,252,287 B1 | 6/2001 | Kurtz et al. | |
| 6,281,426 B1 | 8/2001 | Olson et al. | |
| 6,340,788 B1 | 1/2002 | King et al. | |
| 6,504,091 B2 | 1/2003 | Hisamatsu et al. | |
| 6,617,618 B2 | 9/2003 | Sato | |
| 6,660,928 B1 * | 12/2003 | Patton et al. | 136/249 |
| 6,756,325 B2 | 6/2004 | Bour et al. | |
| 6,764,926 B2 | 7/2004 | Takeuchi et al. | |
| 6,765,238 B2 | 7/2004 | Chang et al. | |
| 6,787,385 B2 | 9/2004 | Barber et al. | |
| 6,815,736 B2 | 11/2004 | Mascarenhas | |
| 6,951,819 B2 | 10/2005 | Iles et al. | |
| 7,071,407 B2 | 7/2006 | Faterni et al. | |
| 7,119,271 B2 | 10/2006 | King et al. | |
| 7,122,733 B2 | 10/2006 | Narayanan et al. | |
| 7,122,734 B2 | 10/2006 | Fetzer et al. | |
| 7,123,638 B2 | 10/2006 | Leary et al. | |
| 7,126,052 B2 | 10/2006 | Fetzer et al. | |
| 7,255,746 B2 | 8/2007 | Johnson et al. | |
| 7,279,732 B2 | 10/2007 | Meng et al. | |
| 7,709,287 B2 | 5/2010 | Fatemi et al. | |
| 7,727,795 B2 | 6/2010 | Stan et al. | |
| 7,807,921 B2 | 10/2010 | Fetzer et al. | |
| 7,842,881 B2 | 11/2010 | Comfeld et al. | |
| 8,067,687 B2 | 11/2011 | Wanlass | |
| 8,575,473 B2 * | 11/2013 | Jones et al. | 136/255 |
| 2002/0195137 A1* | 12/2002 | King et al. | 136/249 |
| 2003/0070707 A1 | 4/2003 | King et al. | |
| 2003/0145884 A1 | 8/2003 | King et al. | |
| 2004/0045598 A1 | 3/2004 | Narayanan et al. | |
| 2004/0200523 A1 | 10/2004 | King et al. | |
| 2005/0155641 A1 | 7/2005 | Fafard | |
| 2005/0274409 A1 | 12/2005 | Fetzer et al. | |
| 2006/0144435 A1 | 7/2006 | Wanlass | |
| 2006/0162768 A1 | 7/2006 | Wanlass et al. | |
| 2007/0034853 A1 | 2/2007 | Robbins et al. | |
| 2007/0131275 A1 | 6/2007 | Kinsey et al. | |
| 2007/0227588 A1 | 10/2007 | Gossard et al. | |
| 2008/0035939 A1 | 2/2008 | Puetz et al. | |
| 2008/0149173 A1 | 6/2008 | Sharps | |
| 2008/0245400 A1 | 10/2008 | Li | |
| 2008/0257405 A1 | 10/2008 | Sharps | |
| 2009/0001412 A1* | 1/2009 | Nagai et al. | 257/184 |
| 2009/0014061 A1* | 1/2009 | Harris et al. | 136/255 |
| 2009/0057721 A1* | 3/2009 | Miura et al. | 257/201 |
| 2009/0078310 A1 | 3/2009 | Stan et al. | |
| 2009/0145476 A1 | 6/2009 | Fetzer et al. | |
| 2009/0155952 A1 | 6/2009 | Stan et al. | |
| 2009/0229659 A1 | 9/2009 | Wanlass et al. | |
| 2009/0255575 A1 | 10/2009 | Tischler | |
| 2009/0255576 A1 | 10/2009 | Tischler | |
| 2009/0272438 A1 | 11/2009 | Cornfeld | |
| 2009/0288703 A1 | 11/2009 | Stan et al. | |
| 2010/0087028 A1* | 4/2010 | Porthouse et al. | 438/61 |
| 2010/0096001 A1 | 4/2010 | Sivananthan et al. | |
| 2010/0180936 A1 | 7/2010 | Kim | |
| 2010/0218819 A1 | 9/2010 | Farmer et al. | |
| 2010/0282305 A1* | 11/2010 | Sharps et al. | 136/255 |
| 2010/0282306 A1* | 11/2010 | Sharps et al. | 136/255 |
| 2010/0319764 A1 | 12/2010 | Wiemer et al. | |
| 2011/0023958 A1 | 2/2011 | Masson et al. | |
| 2011/0114163 A1 | 5/2011 | Wiemer et al. | |
| 2011/0210313 A1* | 9/2011 | Fujii et al. | 257/21 |
| 2011/0232730 A1* | 9/2011 | Jones et al. | 136/255 |
| 2012/0103403 A1 | 5/2012 | Misra et al. | |
| 2012/0211071 A1 | 8/2012 | Newman et al. | |
| 2012/0216858 A1 | 8/2012 | Jones-Albertus et al. | |
| 2012/0216862 A1* | 8/2012 | Abou-Kandil et al. | 136/258 |
| 2012/0227797 A1 | 9/2012 | Stan et al. | |
| 2012/0285526 A1 | 11/2012 | Jones-Albertus et al. | |
| 2013/0014815 A1 | 1/2013 | Jones-Albertus et al. | |
| 2013/0118546 A1* | 5/2013 | Jones-Albertus et al. | 136/244 |
| 2013/0118566 A1* | 5/2013 | Jones-Albertus et al. | 136/255 |
| 2013/0220409 A1* | 8/2013 | Jones-Albertus et al. | 136/255 |

FOREIGN PATENT DOCUMENTS

| | | |
|---|---|---|
| WO | 2010/151553 A1 | 12/2010 |
| WO | 2011/062886 A1 | 5/2011 |
| WO | 2011/123164 A1 | 10/2011 |
| WO | 2012/057874 A1 | 5/2012 |
| WO | 2012/115838 A1 | 8/2012 |
| WO | 2012/154455 A1 | 11/2012 |

OTHER PUBLICATIONS

Ferguson et al., Nonradiative Recombination in 1.56 um GaIn-NAsSb/GaNAs Quantum-Well Lasers, pp. 1-3, published online Dec. 8, 2009, Applied Physics Letters 95, 231104 (2009).*

Harris Jr. et al., "Development of GaInNAsSb alloys: Growth, band structure, optical properties and applications," 2007, Physics Status Solidi(b), vol. 244, Issue 8, pp. 2707-2729, Jul. 6, 2007.*

Jackrel et al., "GaInNAsSb Solar Cells Grown by Molecular Beam Epitaxy," pp. 1-16, IEEE 4th World Conference on Photovoltaic Energy Conversion, Waikoloa, HI, 2006.*

Bank, et al., "Molecular-beam epitaxy growth of low-threshold cw GaInNAsSb lasers at 1.5 μm," pp. 1337-1340, J. Vac. Sci. Technol. B 23(3), May/Jun. 2005.

Bertness et al., "29.5%—Efficient GaInP/GaAs Tandem Solar Cells," Applied Physics Letters, vol. 65, Aug. 22, 1994, pp. 989-991.

Cotal et al., "III-V multijunction solar cells for concentrating photovoltaics" pp. 174- 192, www.rsc.org/ees, Energy and Environmental Science 2, (2009).

Denton et al., Vegard's Law, Physical Review, A, The American Physical Society, vol. 43 No. 6, pp. 3161-3164 (1991).

Ferguson et al., Nonradiative Recombination in 1.56 μm GaIn-NAsSb/GaNAs Quantum-Well Lasers, pp. 1-3, published online Dec. 8, 2009, Applied Physics Letters 95, 231104 (2009).

Fewster P.F., "X-Ray Scattering From Semiconductors" Second Edition, Imperial College Press, London, 2003, Ch. 1, pp. 1-22.

Friedman et al., "Analysis of the GaInP/GaAs/1-eV/Ge Cell and Related Structures for Terrestrial Concentration Application," pp. 856-859, Conference Record of the Twenty-ninth IEEE Photovoltaic Specialists Conference, New Orleans, LA., May 19-24, 2002.

Friedman et al., Breakeven Criteria for the GaInNAs Junction in GaInP/GaAs/GaInNAs/Ge Four-junction Solar Cells, pp. 331-344, Progress in Photovoltaics: Research and Applications. (2002).

Friedman et al., "Analysis of Depletion-Region Collection in GaIn-NAs Solar Cells," pp. 691-694, Conference Record of the Thirty-first IEEE Photovoltaic Specialists Conference, Lake Buena Vista, Florida, Jan. 3-7, 2005.

Garcia et al., Analysis of Tellurium As N-Type Dopant in GaInP: Doping, Diffusion, Memory Effect and Surfactant Properties, pp. 794-799, Journal of Crystal Growth 298 (2007).

Geelen et al., Epitaxial Lift-Off GaAs Solar Cell From a Reusable GaAs Substrate, pp. 162-171, Materials Science and Engineering B45 (1997).

Geisz et al., "Inverted GaInP / (In)GaAs / InGaAs triple-junction solar cells with low-stress metamorphic bottom junctions," Proceedings of the 33rd IEEE PVSC Photovoltaics Specialists Conference, (2008).

Green et al., Progress in Photovoltaics: Research and Applications 19 (2011) pp. 565-572.

(56) References Cited

OTHER PUBLICATIONS

Green et al., Progress in Photovoltaics: Research and Applications 20 (2012) pp. 12-20.
Green, "Third Generation Photovoltaics: Advanced Solar Energy Conversion," pp. 95-109, Springer Publishing, Berlin, Germany (2003).
Green, Do Built-in Fields Improve Solar Cell Performance? pp. 57-66, Progress in Photovoltaics: Research and Applications (2009), Published online in Wiley InterScience (www.interscience.wiley.com) on Oct. 1, 2008.
Gu et al., "Gas Source Growth and Doping Characteristics of AlInP on GaAs" Materials Science and Engineering B 131 (2006), pp. 49-53.
Harris Jr. et al., "Development of GaInNAsSballoys: Growth, band structure, optical properties and applications," 2007, Physics Status Solidi(b), vol. 244, Issue 8, pp. 2707-2729, Jul 6, 2007.
Hovel H.J., "Semiconductors and Semimetals", Academic Press, New York, 1975, Ch. 2, pp. 8-47.
Jackrel et al., "GaInNAsSb Solar Cells Grown by Molecular Beam Epitaxy," 2006. Photovoltaic Energy Conversion, Conference Record of the 2006 IEEE 4th World Conference, vol. 1, p. 783-786, May 2006.
Jackrel et al., "Dilute nitride GaInNAs and GaInNAsSb solar cells by molecular beam epitaxy", pp. 1-8, Journal of Applied Physics 101 (114916), Jun. 14, 2007.
Janotti et. al., Mutual Passivation of Electrically Active and Isovalent Impurities in Dilute Nitrides, Physical Review Letters 100, 045505 (2008).
King et al., "High-Voltage, Low-Current GaInP/GaInP/GaAs/GaInNAs/Ge Solar Cells" Spectrolab Inc., 2002, pp. 852-855.
King et al., "40% Efficient Metamorphic GaInP/GaInAs/Ge Multijunction Solar Cells," J. of Applied Physics Letters, May 4, 2007.
Kudrawiec, "Contactless electroreflectance of GaInNAsSb/GaAs single quantum wells with indium content of 8%-32%", Jan. 2007, Journal of Applied Physics, vol. 101, pp. 013504-1 -013504-9.
Kurtz et al., "Projected Performance of Three and Four-Junction Devices Using GaAs and GaInP," pp. 875-878, 26th IEEE Photovoltaics Specialists Conference, (1997).
Law et al., "Future technology pathways of terrestrial III-V multijunction solar cells for concentrator photovoltaic systems," Solar Energy Materials & Solar Cells 94 (2010) pp. 1314-1318.
Merrill et al., Directions and Materials Challenges in High Performance Photovoltaics, Dec. 2007, JOM Energetic Thin Films, 59, 12, 26-30.
Miyashita et al., Effect of Indium Composition on GaInNAsSb Solar Cells Grown by Atomic Hydrogen-Assisted Molecular Beam Epitaxy, pp. 000632-000635, 978-1-4244-2950@ 2009 IEEE.
Miyashita et al., "Improvement of GaInNAsSb films fabricated by atomic hydrogen-assisted molecular beam epitaxy", pp. 3249-3251, Journal of Crystal Growth 311, 2009.
Ng et al., 1EV GANXAS1-X-YSBY Material for Lattice-Matched III-V Solar Cell Implementation on GAAS and GE, pp. 76-80, (2009).
Olson J.M. et al., "High-Efficiency III-V Multijunction Solar Cells" Handbook of Photovoltaic Science and Engineering, 1st ed.; Luque, A., Hegedus, S., Eds.; Wiley: New York, NY, USA, 2003; Chapter 9, pp. 359-411.
Ptak et al., "Effects of Temperature, Nitrogen Ions and Antimony on Wide Depletion Width GaInNAs," pp. 955-959.J. Vac. Sci. Tech. B25(3), May/Jun. 2007 (published May 31, 2007).
Ptak et al., "Low-acceptor-Concentration GaInNAs grown by Molecular-beam Epitaxy for High-current p-i-n. solar cell applications." J. of Applied Physics, 98.094501 (2005).
Ptak et al., "Defects in GaInNAs: What We've Learned so Far" National Renewable Energy Laboratory NREL/CP-520-33555, May 2003, 7 pages.
Sabnis et al., A new roadmap for space solar cells, Industry Photovoltaics, www.compoundsemiconductor.net/csc/features-details/19735471, Aug./Sep. 2012, 5 pages.
Solar Junction Inc, "Sharp Develops Solar Cell with Word's Highest Conversion Efficiency of 35.8%" Press Release, dated Oct. 22, 2009, 3 pages.
Volz et al., Optimization of Annealing Conditions of (GaIn)(NAs) for Solar Cell Applications, pp. 2222-2228, Journal of Crystal Growth 310 (2008).
Volz et al., MOVPE growth of dilute nitride III/V semiconductors using all liquid metalorganic precursors, Journal of Crystal Growth 311 (2009), pp. 2418-2526.
Wiemer et al., "43.5% Efficient Lattice Matched Solar Cells" Proc. SPIE 810804 (2011), 5 pages.
Wistey et al., Nitrogen Plasma Optimization for High-Quality Dilute Nitrides, pp. 229-233, Journal of Crystal Growth, available online on Feb. 1, 2005 at http://www.sciencedirect.com.
Wu et al., Band Anticrossing in Highly Mismatched III-V Semiconductor Alloys, pp. 860-869, Semiconductor Science and Technology 17 (2002).
Yamaguchi et al., "Multi-junction III-V solar cells: current status and future potential", in: Solar Energy, vol. 79, issue 1, Jul. 2005.
Yu et. al., Mutual Passivation of Group IV Donors and Nitrogen in Diluted GaNxAs1-x Alloys, pp. 2844-2846, Applied Physics Letters, vol. 83, No. 14 (Oct. 6, 2003).
International Search Report and Written Opinion PCT/US2008/008495 mailed Apr. 6, 2009, 5 pages.
International Preliminary Report on Patentability PCT/US2008/008495 dated Jan. 12, 2010, 5 pages.
International Search Report and Written Opinion corresponding to the PCT application No. PCT/US10/39534, date of mailing Sep. 8, 2010, 8 pages.
International Search Report and Written Opinion corresponding to the PCT application No. PCT/US10/56800, date of mailing Jan. 26, 2011, 8 pages.
International Search Report and Written Opinion corresponding to the PCT application No. PCT/US2010/061635, date of mailing Mar. 1, 2011, 7 pages.
International Search Report and Written Opinion corresponding to the PCT application No. PCT/US11/36486, date of mailing Aug. 25, 2011, 12 pages.
International Preliminary Report on Patentability for PCT Application No. PCT/US2010/056800, mailed on May 31, 2012, 6 pages.
International Search Report and Written Opinion of the International Searching Authority for PCT Application No. PCT/US12/36020, mailed on Aug. 14, 2012, 11 pages.
International Search Report and Written Opinion of the International Searching Authority for PCT Application No. PCT/US12/25307, mailed on Aug. 16, 2012, 13 pages.
Non-Final Office Action of Jun. 10, 2010 for U.S. Appl. No. 12/217,818, 15 pages.
Final Office Action of Jan. 1, 2011 for U.S. Appl. No. 12/217,818, 15 pages.
Non-Final Office Action of Oct. 5, 2012 for U.S. Appl. No. 12/944,439, 15 pages.
Non-Final Office Action of Oct. 24, 2012 for U.S. Appl. No. 12/749,076, 17 pages.
Non-Final Office Action of Nov. 8, 2012 for U.S. Appl, No. 13/104,913, 12 pages.
Non-Final Office Action of Dec. 14, 2012 for U.S. Appl. No. 13/618,496, 16 pages.
Amendment and Response filed on Nov. 15, 2013 for U.S. Appl. No. 13/739,989, 22 pages, including Table 1 and Table 2.
Declaration Under 37 C.F.R. § 1.132 of Homan Yuen filed for U.S. Appl. No. 13/739,989 on Nov. 15, 2013, pp. 1-10.
Declaration Under 37 C.F.R. § 1.132 of Jerry Olson filed for U.S. Appl. No. 13/739,989 on Nov. 15, 2013, pp. 1-5.
Declaration Under 37 C.F.R. § 1.132 of Minjoo Lee filed for U.S. Appl. No. 13/739,989 on Nov. 15, 2013, pp. 1-6.
Non-Final Office Action mailed on May 15, 2013, for U.S. Appl. No. 13/739,989, 7 pages.
Final Office Action mailed on May 29, 2013, for U.S. Appl. No. 12/944,439, 11 pages.
Final Office Action mailed on Sep. 9, 2013, for U.S. Appl. No. 12/819,534, 13 pages.

(56) References Cited

OTHER PUBLICATIONS

Non-Final Office Action mailed on Feb. 21, 2013, for U.S. Appl. No. 12/819,534, 8 pages.
Final Office Action mailed on Sep. 6, 2013, for U.S. Appl. No. 12/914,710, 17 pages.
Non-Final Office Action mailed on Feb. 15, 2013, for U.S. Appl. No. 12/914,710, 13 pages.
Final Office Action mailed on Oct. 2, 2013, for U.S. Appl. No. 13/104,913, 12 pages.
Final Office Action mailed on Feb. 6, 2013, for U.S. Appl. No. 13/618,496, 8 pages.
Notice of Allowance mailed on Mar. 22, 2013, for U.S. Appl. No. 13/618,496, 8 pages.
Final Office Action mailed on Oct. 1, 2013, for U.S. Appl. No. 13/708,791, 15 pages.
Non-Final Office Action mailed on Apr. 25, 2013, for U.S. Appl. No. 13/708,791, 16 pp.
Friedman et al., "1-eV Solar cells with GaInNAs active layer", Journal of Crystal Growth, vol. 195, 1998, p. 409-415.
Kurtz et al., "Understanding the potential and limitations of dilute nitride alloys for solar cells", Paper No. NREL/CP-520-38998, DOE Solar Energy Technologies Conference, Denver, CO, Nov. 7-10, 2005, 5 pages.
E. Wesoff, "Update: Solar Junction breaking CPV efficiency records, raising $30M", Greentech Media, Apr. 15, 2011, 4 pages.
E. Wesoff, "CPV Roundup: SolFocus funding, 5MW order for Solar Junction, GreenVolts, Amonix", Greentech Media, May 22, 2012, 3 pages.
E. Wesoff, "Record 44 percent CPV efficiency from startup Solar Junction", Greentech Media, Oct. 15, 2012, 3 pages.
Weyers et al., "Red shift of photoluminescence and absorption in dilute GaAsN alloy layers", Japan Journal of Applied Physics, vol. 31, Issue 7A, 1992, p. L853-L855.
"IQE's CPV materials successfully qualified for high-volume production by Solar Junction", Semiconductor Today, Aug. 2013, 2 pages.
"Fraunhofer ISE, Solitec, Leti and Helmholz Center achieve record 44.7% solar cell efficiency", Semiconductor Today, Sep. 2013, 2 pages.
"Solar Junction beats its own record with 44.1% efficiency", Compound Semiconductor, Aug. 2013, 1 page.

\* cited by examiner

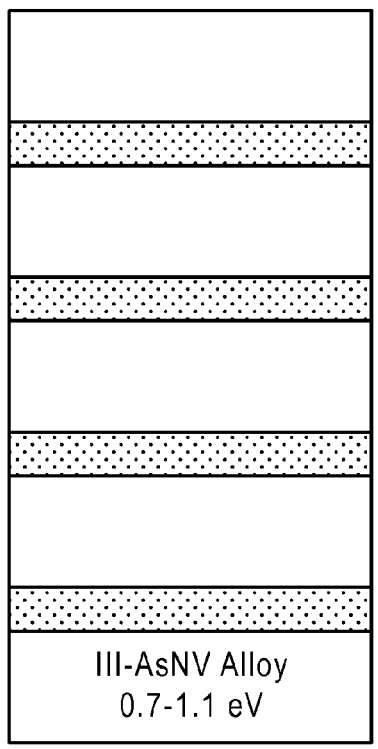
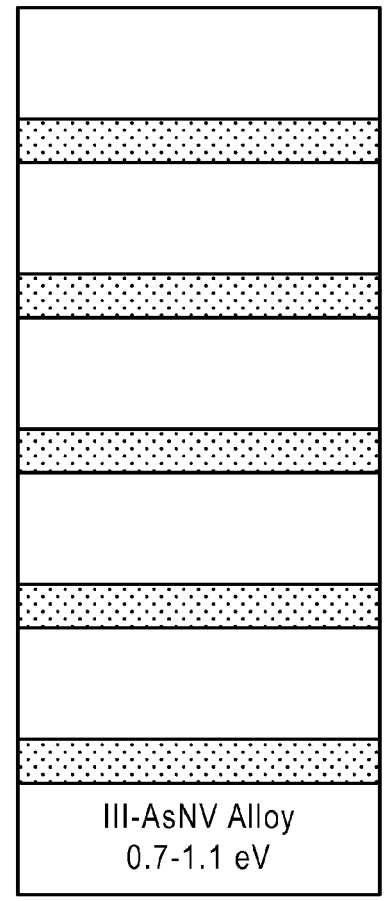
FIG. 1A
FIG. 1B

| |
|---|
| Anti-reflection Coating |
| AlInP Window (10-50 nm) |
| (Al)InGaP Emitter (20-200 nm) |
| (Al)InGaP Base<br>1.9-2.2 eV, 0.1-2.0 um |
| AlInGaP BSF (50-300 nm) |
| Al(In)GaAs / (In)GaAs TJ (≤20 nm) |
| (Al)InGaP Window (50-300 nm) |
| (Al,In)GaAs Emitter (100-200 nm) |
| (Al,In)GaAs Base<br>1.4-1.7 eV, 1-4 um |
| Al(In)GaAs BSF (50-300 nm) |
| Al(In)GaAs / (In)GaAs TJ (≤80 nm) |
| InGaP Window (50-300 nm) |
| (In)GaAs Emitter (100-200 nm) |
| III-AsNV Base<br>0.9-1.3 eV, 1-4 uM |
| (In)GaAs BSF (50-300 nm) |
| (In)GaAs / (In)GaAs TJ (≤80 nm) |
| (In)GaAs Window (50-300 nm) |
| (In)GaAs Emitter (50-200 nm) |
| III-AsNV Base<br>0.7-1.1 eV, 1-4 um |
| (In)GaAs BSF (50-300 nm) |
| (In)GaAs Buffer |
| Substrate |

FIG. 16

HIGH EFFICIENCY MULTIJUNCTION SOLAR CELLS

This application is a continuation of U.S. application Ser. No. 13/678,389 filed on Nov. 15, 2012, which claims the benefit under 35 U.S.C. §119(e) of U.S. Provisional Application No. 61/559,982 filed on Nov. 15, 2011, which is incorporated by reference in its entirety.

BACKGROUND

The present invention relates to solar cells, and in particular to high efficiency, multijunction solar cells formed primarily of III-V semiconductor alloys.

The highest known solar cell efficiencies have been produced by multijunction solar cells comprised primarily of III-V semiconductor alloys. Such alloys are combinations of elements drawn from columns IIIA and VA of the standard Periodic Table, identified hereinafter by their standard chemical symbols, names and abbreviations, and wherein the total number of elements from column IIIA is substantially equal to the total number of elements from column VA. The high efficiencies of these solar cells make them attractive for terrestrial concentrating photovoltaic systems and systems designed to operate in space.

Historically, the highest efficiency solar cells have consisted of a monolithic stack of three subcells, which are equivalently referred to as junctions, grown on germanium (Ge) or gallium arsenide (GaAs) substrates. The subcells contain the regions of the solar cell where light energy in a range of wavelengths is absorbed and converted into electrical energy that may be collected externally. The subcells may be interconnected with one another by tunnel junctions. Other layers, such as buffer layers, may also exist between the subcells. In the highest efficiency solar cells demonstrated to date, the top subcell has one or more absorbing layers made of (Al)GaInP, the intermediate subcell has one or more absorbing layers made of (In)GaAs, and the bottom subcell includes a Ge substrate or has absorbing layers made of a III-V material. The foregoing nomenclature for a III-V alloy, wherein a constituent element is shown parenthetically, such as Al in (Al)InGaP, denotes a condition of variability in which that particular element can be zero.

Each subcell comprises several associated layers, typically including a window, emitter, base and back surface field (BSF). These terms are well known to those skilled in the art and do not need further definition here. Each of the foregoing layers may itself include one or more sublayers. The window and emitter will be of one doping polarity (e.g., n-type) and the base and back surface field will be of the opposite polarity (e.g., p-type), with a p-n or n-p junction formed between the base and the emitter. If the base contains an intrinsic region in addition to an intentionally doped region, then it may be considered a p-i-n or n-i-p junction, as is well known to those skilled in the art. By convention, the specific alloy and the band gap of a given subcell are considered to be the name and the band gap, respectively, of the material forming the base. This material may or may not also be used for the window, emitter and back surface field of the subcell. For example, a subcell comprising an AlInP window, an InGaP emitter, a GaAs base and an AlGaAs back surface field would be denoted a GaAs subcell and its band gap would be the GaAs band gap of 1.4 eV. A subcell comprising an AlInP window, an InGaP emitter, an InGaP base and an InGaP back surface field would be denoted an InGaP subcell, and its band gap would be that of the InGaP base. The subcell may include layers in addition to those listed above. Those skilled in the art will also recognize that subcells may also be constructed without one or more of the foregoing layers. For example, subcells may be constructed without a window or without a back surface field.

When speaking about the stacking order of the subcells from top to bottom, the top subcell is defined to be the subcell closest to the light source during operation of the solar cell, and the bottom subcell is furthest from the light source. Relative terms like "above," "below," "upper," and "lower" also refer to position in the stack with respect to the light source. The order in which the subcells were grown is not relevant to this definition. The top subcell is also denoted "J1," with "J2" being the second subcell from the top, "J3" being third from the top, and the highest number going to the bottom subcell.

Three junction solar cells have reached the highest efficiencies of any solar cells to date. See M. A. Green et al., Progress in Photovoltaics: Research and Applications 19 (2011) 565-572. However, these three junction solar cells are approaching their practical efficiency limits. To reach significantly higher efficiencies, additional junctions or subcells are needed. With additional subcells, photons can be absorbed more efficiently by materials with band gaps closer to the photon energies, which are able to convert more light energy into electrical energy rather than heat. In addition, the total solar cell current with additional subcells may be lower for a given amount of incident light, which may reduce series resistance losses. Another mechanism for increasing efficiency is to absorb a larger fraction of the solar spectrum with additional subcell(s). For many years, there has been widespread recognition of the need for higher numbers of junctions, but to date, the attempt to build cells of four, five and six junctions has failed to produce solar cells with efficiencies that exceeded the efficiencies of the best three-junction solar cells. The reasons for failure have been unclear, although material and design flaws have been suspected, including poor material quality, which can be a result of dislocations produced by the use of lattice-mismatched layers. There are additional challenges related to the increased number of tunnel junctions required to interconnect the additional subcells, including the loss of light by tunnel junction absorption.

There has long been interest in high efficiency, lattice-matched multijunction solar cells with four or more subcells, but suitable materials for creating high efficiencies while maintaining lattice matching among the subcells and to a substrate have previously been elusive. For example, U.S. Pat. No. 7,807,921 discusses the possibility of a four junction, lattice-matched solar cell with GaInNAs as the material for a 1.0 eV subcell. However, the applicant concluded that this design is impractical because GaInNAs that is lattice matched to the other subcells exhibited poor quality when produced by then known techniques. To overcome the problems with finding feasible, lattice-matched structures, the patent teaches the use of metamorphic materials including a graded metamorphic layer of GaInNAs that is not lattice matched. In another attempt to make a 1 eV subcell that may be lattice-matched to the traditional InGaP/(In)GaAs/Ge solar cell, a material consisting of gallium, indium, nitrogen, arsenic and various concentrations of antimony was studied, but these investigators concluded that antimony, even in small concentrations should be avoided as it was considered detrimental to device performance. See Ptak et al., Journal of Vacuum Science Technology B 25(3) May/June 2007 pp. 955-959.

Prior work in this general field demonstrates that a high level of skill in the art exists for making materials, so that it is not necessary to disclose specific details of the processes of making the materials for use in solar cells. Several representative U.S. patents are exemplary. U.S. Pat. No. 6,281,426 discloses certain structures and compositions without disclosing fabrication techniques and refers to other documents for guidance on growth of materials. U.S. Pat. No. 7,727,795 relates to inverted metamorphic structures for solar cells in which exponential doping is disclosed.

What is needed to continue the progress toward higher efficiency solar cells are designs for multijunction solar cells with four or more subcells that can reach higher efficiencies than can be practically attained with three junction solar cells. It is conventionally assumed that substantially lattice-matched designs are desirable because they have proven reliability and because they use less semiconductor material than metamorphic solar cells, which require relatively thick buffer layers to accommodate differences in the lattice constants of the various materials. It is to be noted that the general understanding of "substantially lattice matched" is that the in-plane lattice constants of the materials in their fully relaxed states differ by less than 0.6% when the materials are present in thicknesses greater than 100 nm. Further, subcells that are substantially lattice matched to each other as used herein means that all materials in the subcells that are present in thicknesses greater than 100 nm have in-plane lattice constants in their fully relaxed states that differ by less than 0.6%.

SUMMARY

The invention includes multijunction solar cells comprising four, five or more subcells having efficiencies that can exceed those of known best solar cells. The multijunction solar cells incorporate at least one subcell that has a base comprising a III-V material containing As, N and at least one additional element from the group containing Sb and Bi, referred to as III-AsNV materials, wherein the composition of the material is tailored for band gap and lattice constant. The aforementioned subcells comprise the bottom subcell and/or the subcell immediately adjacent to the bottom subcell in each of the multijunction solar cells of the invention. The subcells of the multijunction solar cells of the invention are substantially lattice-matched to each other. In certain embodiments, the subcells of the multijunction solar cells are substantially lattice-matched to a substrate. The methodology for determining the physical parameters of the subcells is based upon an accurate simulation that specifies subcell thicknesses and runs an optimization procedure to find band gaps, and therefore material ratios in alloys, by imposing lattice-matching and current-matching between subcells. Solar cells of the desired high quality material composition may then be fabricated based on the material compositions specified by the simulation.

In a specific embodiment two III-AsNV subcells of differing band gaps are fabricated in a single multijunction solar cell, where at least one of the subcells has a band gap higher than previously achievable or suggested. In another specific embodiment, three III-AsNV subcells of differing band gaps are fabricated in a single multijunction solar cell, where at least one of the subcells has a band gap higher than previously achievable or suggested.

In further specific embodiments, designs with four to six junctions are disclosed wherein the bottom subcell has a higher bottom band gap than previously disclosed or suggested.

In further embodiments, solar cells with a bottom III-AsNV subcell with a band gap lower than has previously been achievable for a III-AsNV alloy that is substantially lattice-matched to a substrate are disclosed.

While there has been a body of work in multijunction cells, the material parameters and specific structures developed in the present invention and discussed herein have not been disclosed.

The invention will be better understood by reference to the following detailed description in connection with the accompanying tables and figures which constitute the drawings.

BRIEF DESCRIPTION OF THE DRAWINGS

FIG. 1A is a schematic cross-section of a multijunction solar cell with five subcells illustrating an embodiment of the invention.

FIG. 1B is a schematic cross-section of a multijunction solar cell with six subcells illustrating an embodiment of the invention.

FIG. 16 illustrates a schematic cross section of a more specific example of a multijunction solar cell according to the invention.

DETAILED DESCRIPTION

Figure 2A:
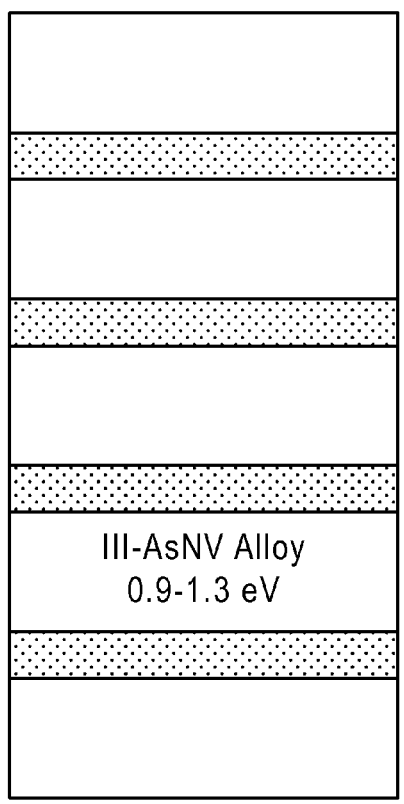
FIG. 2A is a schematic cross-section of a multijunction solar cell with five subcells illustrating still another embodiment of the invention.

"III-AsNV" materials are herein defined to be alloys of elements from group IIIA (i.e., B, Al, Ga, In, Tl) and group VA (i.e., N, P, As, Sb, Bi) of the periodic table, which alloys include As, N and at least one additional element from Sb and Bi. In certain embodiments, the at least one additional element is Sb. In certain embodiments, the at least one additional element is Bi. The alloys may comprise approximately one-half group IIIA elements and one-half group-VA elements. An element may only be considered to be part of the alloy if it is present in an atomic composition of at least 0.05%. Thus, dopants used to create n-type or p-type conductivity (e.g., Mg, Be, Si or Te) are not considered to be part of the alloy. Examples of III-AsNV materials include GaNAsSb, GaInNAsSbBi, and AlInGaNAsSb. In certain embodiments, a III-AsNV material is an alloy of one or more elements from group III on the periodic table, nitrogen, arsenic, and at least one element selected from Sb and Bi. The expression "elements from group III on the periodic table" as used herein refers to one or more elements from group III on the periodic table. For example, in certain embodiments, an alloy comprises one element from group III on the periodic table, and in certain embodiments, more than one element from group III on the periodic table, such as two elements from group III on the periodic table.

III-AsNV materials are advantageous as solar cell materials because their lattice constants can be varied to be substantially matched to a broad range of substrates and/or subcells formed from other than III-AsNV materials. Their lattice constants can be controlled by the relative fractions of the different group IIIA and group VA elements. Thus, by tailoring the compositions (i.e., the elements and quantities) of III-AsNV materials, a wide range of lattice constants and band gaps may be obtained. Further, high quality material may be obtained by optimizing the composition around a specific lattice constant and band gap, while limiting the total Sb and/or Bi composition to no more than 20 percent of the Group V lattice sites, in certain embodiments to no more than 3 percent of the Group V lattice sites, and in certain embodiments, to no more than 1 percent of the Group V lattice sites. The Sb and/or Bi are believed to act as surfactants to promote smooth growth morphology of the III-AsNV alloys. In addition, they facilitate uniform incorporation of nitrogen and minimize the formation of nitrogen-related defects. The incorporation of Sb and/or Bi enhances the overall nitrogen incorporation and reduces the alloy band gap, aiding the realization of lower band gap alloys. However, there are additional defects created by Sb and/or Bi; for this reason, their total concentration should be limited to no more than 20 percent of the Group V lattice sites. Further, the limit to the Sb and/or Bi composition decreases with decreasing nitrogen composition. Alloys that include In have even lower limits to the total composition of Sb and/or Bi because the In reduces the amount of Sb and/or Bi needed to tailor the lattice constant. For alloys that include In, the total composition of Sb and/or Bi may be limited to no more than 3 percent of the Group V lattice sites, and in certain embodiments, to no more than 1 percent of the Group V lattice sites. For example, $Ga_{1-x}In_xN_yAs_{1-y-z}Sb_z$, disclosed in U.S. Application Publication No. 2011-0232730, which is incorporated by reference, is known to have produced high quality material when substantially lattice-matched to a GaAs or Ge substrate and in the composition range of $0.08 \leq x \leq 0.18$, $0.025 \leq y \leq 0.04$ and $0.001 \leq z \leq 0.03$, with a band gap of at least 0.9 eV. This material is used as the bottom subcell of the solar cell holding the world record for conversion efficiency as of the filing date of the priority application.

In certain embodiments of the invention, the N composition is not more than 7 percent of the Group V lattice sites. In certain embodiments the N composition is not more than 4 percent and in certain embodiments, not more than 3 percent.

The present invention includes multijunction solar cells with four or more subcells incorporating at least one III-AsNV subcell. The band gaps of the III-AsNV materials can be tailored by varying the compositions while limiting the overall composition of Sb and Bi. Thus, III-AsNV subcells with optimal band gaps for integrating with the other subcells may be fabricated while maintaining substantial lattice-matching to the other subcells. The band gaps and compositions of the III-AsNV subcells are tailored so that the short-circuit currents produced by the III-AsNV subcells will be the same as or slightly greater than the other subcells in the solar cell. Because the III-AsNV materials provide high quality, lattice-matched and band gap tunable subcells, the disclosed solar cells comprising III-AsNV subcells will reach conversion efficiencies exceeding those of triple junction solar cells. The boost in efficiency is largely due to less light energy being lost as heat, as the extra subcells allow more of the incident photons to be absorbed by materials with band gaps closer to the energy level of the incident photons. In addition, there will be lower series resistance losses in these multijunction solar cells compared with triple junction solar cells due to the lower operating currents. At higher concentrations of sunlight, the reduced series resistance losses become more pronounced. Depending on the band gap of the bottom subcell, the collection of a wider range of photons in the solar spectrum may also contribute to the efficiency boost.

Designs of multijunction solar cells with more than three subcells in the prior art predominantly rely on metamorphic growth structures, new materials, or dramatic improvements in the quality of existing subcell materials in order to predict structures that can achieve high efficiencies. Solar cells containing metamorphic buffer layers may have reliability concerns due to the potential for dislocations from the buffer layers to propagate over time into the subcells, causing degradation in performance. In contrast, III-AsNV materials can be used today in solar cells with more than three subcells to attain high efficiencies while maintaining substantial lattice-matching between subcells, which is advantageous for reliability. For example, Reliability testing on III-AsNV subcells provided by the present disclosure has shown that such devices survived the equivalent of 390 years of on-sun operation at 100° C. with no failures. The maximum degradation seen in these subcells was a decrease in open-circuit voltage of 1.2%.

For application in space, radiation hardness, which refers to minimal degradation in device performance when exposed to ionizing radiation including electrons and protons, is of great importance. Multijunction solar cells incorporating III-AsNV subcells of the present invention have been subjected to proton radiation testing to examine the effects of degradation in space environments. Compared to Ge-based triple junction solar cells, the results demonstrate that these III-AsNV containing devices have similar power degradation rates and superior voltage retention rates. Compared to non-lattice matched (metamorphic) triple junction solar cells, all metrics are superior for III-AsNV containing devices. In certain embodiments of the invention, the solar cells contain (Al)GaInPAs subcells to improve radiation hardness compared to (Al,In)GaAs subcells.

An enhanced simulation model was used to determine the designs and efficiencies of multijunction solar cells with 4, 5, or 6 subcells. The simulation relied upon the use of standard solar cell equations (see, for example, Nelson, *The Physics of Solar Cells*. London: Imperial College Press, 2003, pp. 145-176; or Kurtz et al., Journal of Applied Physics 68 (1990) 1890) to calculate quantum efficiency, dark current, current, and voltage for an individual subcell, independent of the surrounding subcells, and standard circuit equations for calculating the overall multijunction current-voltage curve from the current-voltage curves of the component subcells, including a single lumped series resistance element. When high illumination intensities ($>10$ W/cm$^2$) were used in these simulations, the dark current was assumed to be dominated by the diffusion current; the contribution from Shockley-Read-Hall recombination in the depletion region was neglected. The simulation varied the band gaps, and thus compositions of the subcells, until the subcells were current-matched. (By current-matched, it is understood to mean that the current generating capacity is substantially the same for each subcell, which is defined as differing by no more than 2 percent and preferably not more than 1 percent. Note that in any multi-junction solar cell with subcells connected in series, the current flowing through each subcell must necessarily be the same. It can be convenient, however, to talk about the short-circuit currents that would be produced by each individual subcell if the subcells were not connected in series, and as though the light to lower subcells was still filtered by the upper subcells. This is what is meant by reference to the current generating capacity of a subcell.) The subcell materials were specified in the simulation, and the band gaps, or the compositions, were varied within specified ranges for each given material alloy system. When the band gap of a given subcell hit the upper end of its allowed range but current-matching had not been achieved, the base thickness was reduced to achieve current-matching. When the band gap of a given subcell hit the lower end of its allowed range, the current-matching requirement was limited to the given subcell and those above it; lower subcells had higher current generating capacities. This is a distinct departure from earlier simulations of this type, which typically vary only the base thickness to match the currents between subcells. The simulation used for this invention is further distinct from other types of simulations in the prior art that vary the band gap of individual subcells to match currents but assume ideal or arbitrary material properties for some or all of the subcells. Such simulations in the prior art will give different results than the simulations employed here, which use experimentally determined material parameters for all subcells except for Ge. The simulation can be used to optimize band gap relationships and current-match for any incident spectrum of light energy, and at any reasonable operating temperature. The simulations used for the invention were carried out using the AM1.5D spectrum at temperatures between 25° C. and 90° C. as inputs. The simulations were run on Matlab software on a Windows operating system.

The simulation model was also used with the AM0 spectrum at 25° C. to predict the designs and efficiencies of multijunction solar cells with 4, 5, and 6 subcells for application in space. Because these simulations were run at 1 sun of illumination, the contribution to the dark current from Shockley-Read-Hall recombination in the depletion region was included. Depending on the application of interest, solar cells for space may be optimized for other operating temperatures and the resulting structures may change slightly from those here.

For the predictive simulations, a perfect anti-reflection coating (ARC) was assumed in order to reduce the computational expense of optimizing the ARC. This can cause the predictive efficiencies to be inflated by approximately two to four percent (e.g., 40.8% instead of 40.0%). For the simulation of existing single and triple junction solar cells, a realistic ARC was included in the simulation of solar cells having an ARC, in order to more accurately model the experimental results.

Unique to the simulation used for this invention is the use of accurate material parameters for the alloy systems of interest that are substantially lattice-matched to GaAs and Ge substrates, including (Al)InGaP, (Al,In)GaAs, and GaIn-NAsSb, an example of III-AsNV material. These material parameters can be used to predict, among other values, the quantum efficiency and the dark current. For these material systems, a range of compositions were found in which the primary effect on quantum efficiency and dark current was the change in band gap. As a result, the other material parameters could be treated as constant with accurate results. For example, for (Al)InGaP, the range of compositions in which the material parameters other than band gap could be treated as constant for subcells substantially lattice-matched to GaAs or Ge was $x \leq 0.2$ for $Al_xIn_{0.5}Ga_{1-x}P$.

Material parameters for (Al)GaInPAs and SiGe(Sn) were not included in the simulation, but high efficiency solar cell structures using (Al)GaInPAs and SiGe(Sn) may be designed with the same methodology.

Figure 20:
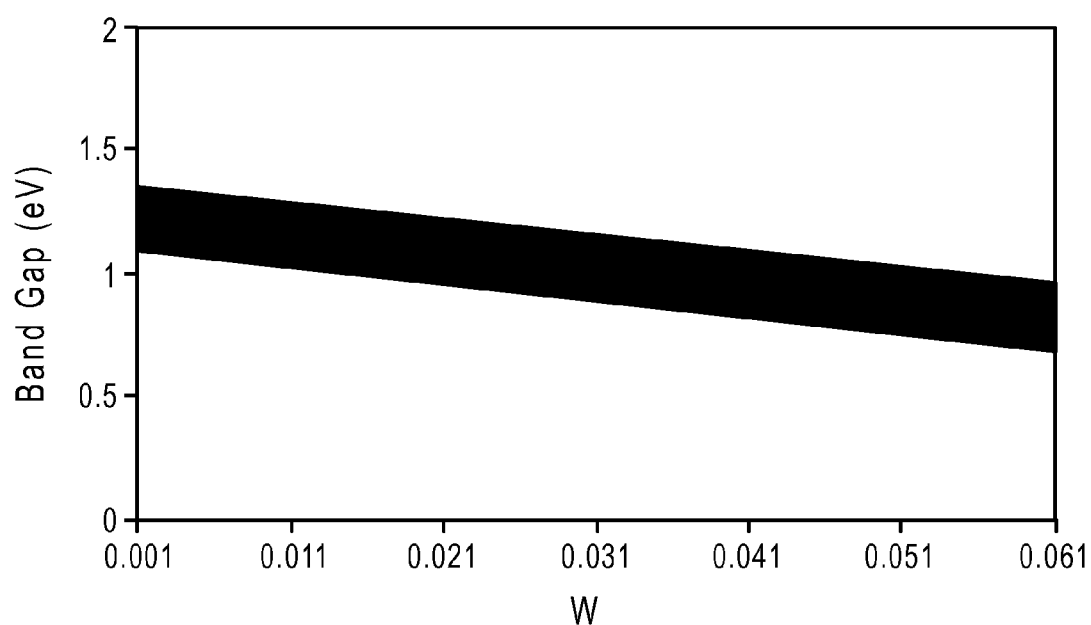
FIG. 20 shows the calculated band gap as a function of composition for $Ga_{1.01-3w}In_{3w-0.01}N_wAs_{0.99-w}Sb_{0.01}$.

The material parameters for each material system in the simulation included the band gap, the n and k values (i.e., the refractive index), the hole and electron effective masses, the static dielectric constant, the minority carrier mobilities, the minority carrier lifetimes and the surface recombination velocities for interfaces with relevant materials. The n and k values were determined from ellipsometry measurements for some materials and taken from the literature for other materials, and were shifted as a function of band gap energy as necessary within a given alloy system. The effective masses and static dielectric constants were taken from the literature for (Al)InGaP and (Al,In)GaAs. For GaInNAsSb the values used were 0.6 $m_0$, 0.15 $m_0$ and 13.3 for the hole and electron effective masses and the static dielectric constant respectively, where $m_0$ is the electron effective mass. Material parameters were assumed to be constant with temperature in the range simulated, except for the band gap and the n and k values, which shifted with the band gap energy. The minority carrier mobilities were initially estimated from the majority carrier mobilities measured on uniformly doped layers using Hall effect measurements, and were refined by fitting experimental quantum efficiency data. The minority carrier lifetimes and surface recombination velocities were determined by time resolved photoluminescence measurements. For Ge, all material parameters were estimates based on available numbers in the literature. Average doping values and material parameters were used in the simulations to treat cases where doping values were graded throughout a layer. The doping values were between $1 \times 10^{17}$ cm$^{-3}$ and $1 \times 10^{19}$ cm$^{-3}$ for n-type layers and between $5 \times 10^{15}$ cm$^{-3}$ and $2 \times 10^{18}$ cm$^{-3}$ for the p-type layers, and were optimized for performance in experimental devices. The relationship between composition and band gap is well known for the (Al)InGaP and (Al,In)GaAs material systems lattice matched to GaAs and Ge, specifying the composition for a given band gap. The band gap of $Ga_{1-x}In_xN_yAs_{1-y-z}Sb_z$ is not a simple function of composition due to interactions between the different elements, as well as factors such as the strain in the layer. The composition that yields a desired band gap with a specific lattice constant will be found by varying the composition in an optimization procedure. As an example, the relationship between band gap and composition w for $Ga_{1.01-3w}In_{3w-0.01}N_wAs_{0.99-w}Sb_{0.01}$ is shown in FIG. 20. Here, the Sb composition is fixed. Similar plots may be constructed for different Sb compositions or with other elements held constant.

The thermal dose, which is controlled by the intensity of heat applied for a given duration of time (e.g., application of a temperature of 600° C. to 900° C. for a duration of between 10 seconds to 10 hours), that a III-AsNV material receives during growth and after growth, also affects the relationship between band gap and composition. In general, the band gap increases as thermal dose increases.

As development continues on the above-described materials, it is expected that material quality will continue to improve, enabling even higher efficiencies from the same structures described in this invention. The simulation was also run with improved minority carrier properties to predict structures and performance of future devices.

The use of the simulation over the temperature ranges from 25° C. to 90° C. is supported by data for triple junction solar cells with a bottom GaInNAsSb subcell operating from 25° C. to 125° C.

As composition is varied within a given alloy system, the growth conditions need to be modified, as is well known to those skilled in the art. For example, for (Al,In)GaAs, the growth temperature will increase as the fraction of Al increases and decrease as the fraction of In increases, in order to maintain the same material quality. Thus, as a composition is changed, the growth temperature as well as other growth conditions can be adjusted accordingly.

Tables 1A and 1B show the short-circuit current, open circuit voltage and fill factor from both simulated I-V curves and experimental data for $Al_{0.1}In_{0.5}Ga_{0.4}P$ and $In_{0.5}Ga_{0.5}P$ subcells, respectively, exposed to incident solar radiation of the stated intensity using an AM1.5D spectrum at 25° C. The close conformance between simulation and experimental results is a verification of the accuracy of the simulation. The number of suns listed for each table gives information about the illumination intensity incident on the cell during testing. It is the number of multiples of "one sun" intensity (0.1 W/cm$^2$) incident on the cell. For example, the term "800 suns" indicates 80 W/cm$^2$. The numbers of suns differs for each case because the existing experimental data was taken at different intensities. The incident spectrum approximated the AM1.5D spectrum in the experimental measurements and was the AM1.5D spectrum in the simulations.

TABLE 1A

Simulated and experimental solar cell data for an $Al_{0.1}In_{0.5}Ga_{0.4}P$ subcell illuminated at 525 suns under the AM1.5D spectrum.

| | $Al_{0.1}In_{0.5}Ga_{0.4}P$ subcell at 525 Suns | |
|---|---|---|
| | Simulated Data | Experimental Data |
| Short-circuit current | 6.3 A/cm$^2$ | 6.2 A/cm$^2$ |
| Open-circuit voltage | 1.68 V | 1.70 V |
| Fill Factor | 84% | 82% |

TABLE 1B

Simulated and experimental solar cell data for an $In_{0.5}Ga_{0.5}P$ subcell illuminated at 925 suns under the AM1.5D spectrum.

| | $In_{0.5}Ga_{0.5}P$ Subcell at 925 Suns | |
|---|---|---|
| | Simulated Data | Experimental Data |
| Short-circuit current | 13.0 A/cm$^2$ | 12.7 A/cm$^2$ |
| Open-circuit voltage | 1.61 V | 1.63 V |
| Fill Factor | 79% | 80% |

Tables 1C and 1D show the short-circuit current, open circuit voltage and fill factor from both simulated I-V curves and experimental data for $Al_{0.1}In_{0.5}Ga_{0.4}P$ and $In_{0.5}Ga_{0.5}P$ subcells under the air mass zero (AM0) spectrum. The incident spectrum approximated the AM0 spectrum at an intensity of 1,353 W/cm$^2$ at 25° C. in the experimental measurements and was the AM0 spectrum at 25° C. in the simulations. The close conformance between simulation and experimental results is a verification of the accuracy of the simulation.

TABLE 1C

Simulated and experimental solar cell data for an $Al_{0.1}In_{0.5}Ga_{0.4}P$ subcell illuminated under the AM0 spectrum.

| | $Al_{0.1}In_{0.5}Ga_{0.4}P$ Subcell | |
|---|---|---|
| | Simulated Data | Experimental Data |
| Short-circuit current | 16.0 mA/cm$^2$ | 16.2 mA/cm$^2$ |
| Open-circuit voltage | 1.50 V | 1.48 V |
| Fill Factor | 87% | 87% |

TABLE 1D

Simulated and experimental solar cell data for an $In_{0.5}Ga_{0.5}P$ subcell under the AM0 spectrum.

| | $In_{0.5}Ga_{0.5}P$ Subcell | |
|---|---|---|
| | Simulated Data | Experimental Data |
| Short-circuit current | 18.1 A/cm$^2$ | 17.7 mA/cm$^2$ |
| Open-circuit voltage | 1.41 V | 1.41 V |
| Fill Factor | 87% | 89% |

Tables 2A and 2B show analogous data for $Al_{0.2}Ga_{0.8}As$ and GaAs subcells, respectively, and Tables 3A and 3B for $Ga_{0.96}In_{0.04}N_{0.01}As_{0.98}Sb_{0.01}$ and $Ga_{0.96}In_{0.1}N_{0.03}As_{0.96}Sb_{0.01}$ subcells, respectively, exposed to incident solar radiation of the stated intensity using an AM1.5D spectrum at 25° C.

TABLE 2A

Simulated and experimental solar cell data for an $Al_{0.2}Ga_{0.8}As$ subcell illuminated at 1130 suns under the AM1.5D spectrum.

| | $Al_{0.2}Ga_{0.8}As$ Subcell at 1130 Suns | |
|---|---|---|
| | Simulated Data | Experimental Data |
| Short-circuit current | 10.3 A/cm² | 10.4 A/cm² |
| Open-circuit voltage | 1.46 V | 1.43 V |
| Fill Factor | 85% | 83% |

TABLE 2B

Simulated and experimental solar cell data for a GaAs subcell illuminated at 980 suns under the AM 1.5D spectrum.

| | GaAs Subcell at 980 Suns | |
|---|---|---|
| | Simulated Data | Experimental Data |
| Short-circuit current | 17.2 A/cm² | 17.1 A/cm² |
| Open-circuit voltage | 1.22 V | 1.22 V |
| Fill Factor | 78% | 80% |

TABLE 3A

Simulated and experimental solar cell data for a $Ga_{0.96}In_{0.04}N_{0.01}As_{0.98}Sb_{0.01}$ subcell illuminated at 1230 suns under the AM1.5D spectrum.

| | $Ga_{0.96}In_{0.04}N_{0.01}As_{0.98}Sb_{0.01}$ Subcell at 1230 Suns | |
|---|---|---|
| | Simulated Data | Experimental Data |
| Short-circuit current | 6.5 A/cm² | 6.6 A/cm² |
| Open-circuit voltage | 0.84 V | 0.82 V |
| Fill Factor | 81% | 77% |

TABLE 3B

Simulated and experimental solar cell data for a $Ga_{0.9}In_{0.1}N_{0.03}As_{0.96}Sb_{0.01}$ subcell illuminated at 610 suns under the AM1.5D spectrum.

| | $Ga_{0.9}In_{0.1}N_{0.03}As_{0.96}Sb_{0.01}$ Subcell at 610 Suns | |
|---|---|---|
| | Simulated Data | Experimental Data |
| Short-circuit current | 9.5 A/cm² | 9.3 A/cm² |
| Open-circuit voltage | 0.59 V | 0.60 V |
| Fill Factor | 71% | 70% |

Tables 2C and 2D show analogous data for $Al_{0.2}Ga_{0.8}As$ and GaAs subcells, respectively; and Tables 3C and 3D show data for $Ga_{0.96}In_{0.04}N_{0.01}As_{0.98}Sb_{0.01}$ and $Ga_{0.96}In_{0.1}N_{0.03}As_{0.96}Sb_{0.01}$ subcells, respectively, under the AM0 spectrum at an intensity of 1,353 W/cm² at 25° C.

TABLE 2C

Simulated and experimental solar cell data for an $Al_{0.2}Ga_{0.8}As$ subcell under the AM0 spectrum.

| | $Al_{0.2}Ga_{0.8}As$ Subcell | |
|---|---|---|
| | Simulated Data | Experimental Data |
| Short-circuit current | 10.3 mA/cm² | 10.4 mA/cm² |
| Open-circuit voltage | 1.23 V | 1.18 V |
| Fill Factor | 85% | 83% |

TABLE 2D

Simulated and experimental solar cell data for a GaAs subcell under the AM0 spectrum.

| | GaAs Subcell | |
|---|---|---|
| | Simulated Data | Experimental Data |
| Short-circuit current | 18.9 mA/cm² | 19.0 mA/cm² |
| Open-circuit voltage | 1.01 V | 1.00 V |
| Fill Factor | 83% | 85% |

TABLE 3C

Simulated and experimental solar cell data for a $Ga_{0.96}In_{0.04}N_{0.01}As_{0.98}Sb_{0.01}$ subcell under the AM0 spectrum.

| | $Ga_{0.96}In_{0.04}N_{0.01}As_{0.98}Sb_{0.01}$ Subcell | |
|---|---|---|
| | Simulated Data | Experimental Data |
| Short-circuit current | 7.5 mA/cm² | 7.7 mA/cm² |
| Open-circuit voltage | 0.61 V | 0.57 V |
| Fill Factor | 76% | 77% |

TABLE 3D

Simulated and experimental solar cell data for a $Ga_{0.96}In_{0.1}N_{0.03}As_{0.96}Sb_{0.01}$ subcell under the AM0 spectrum.

| | $Ga_{0.96}In_{0.1}N_{0.03}As_{0.96}Sb_{0.01}$ Subcell | |
|---|---|---|
| | Simulated Data | Experimental Data |
| Short-circuit current | 18.2 mA/cm² | 17.9 mA/cm² |
| Open-circuit voltage | 0.40 V | 0.41 V |
| Fill Factor | 70% | 71% |

Validation of the model was also performed by simulating the performance of a state-of-the-art multijunction solar cell comprising three subcells: $In_{0.5}Ga_{0.5}P$ (1.9 eV), GaAs (1.4 eV), and $Ga_{0.9}In_{0.1}N_{0.03}As_{0.96}Sb_{0.01}$ (1.0 eV), with the total subcell thicknesses being 1-2 μm, 4-4.5 μm and 2-3 μm, respectively. Table 4A shows the short-circuit current, open circuit voltage and fill factor of the simulated solar cell under the AM1.5D spectrum concentrated to 525 suns (or 52.5 W/cm²) at 25° C. Also shown is the measured performance of a solar cell with these characteristics and operating conditions. It can be seen that the model accurately predicts the measured performance.

TABLE 4A

Simulated and experimental solar cell data for a solar cell with three subcells illuminated at 525 suns under the AM1.5D spectrum.

| | Solar Cell with 3 Subcells at 525 Suns | |
|---|---|---|
| | Simulated Data | Experimental Data |
| Short-circuit current | 7.3 A/cm$^2$ | 7.3 A/cm$^2$ |
| Open-circuit voltage | 3.37 V | 3.40 V |
| Fill Factor | 87% | 86 % |

Validation of the model was also performed by simulating the performance of a state-of-the-art multijunction solar cell comprising three subcells: $Al_{0.1}In_{0.5}Ga_{0.4}P$ (2.0 eV), GaAs (1.4 eV), and $Ga_{0.9}In_{0.1}N_{0.03}As_{0.96}Sb_{0.01}$ (1.0 eV), with the total subcell thicknesses being 0.75-1.25 μm, 3-4 μm and 2-3 μm, respectively, under the AM0 spectrum. Table 4B shows the short-circuit current, open circuit voltage, and fill factor of the simulated solar cell under the AM0 spectrum at 25° C. Also shown is the measured performance of a solar cell with these characteristics and operating conditions. The model accurately predicts the measured performance under the AM0 spectrum at 25° C.

TABLE 4B

Simulated and experimental solar cell data for a solar cell with three subcells under the AM0 spectrum.

| | Solar Cell with 3 Subcells | |
|---|---|---|
| | Simulated Data | Experimental Data |
| Short-circuit current | 17.1 mA/cm$^2$ | 16.7 mA/cm$^2$ |
| Open-circuit voltage | 2.90 V | 2.92 V |
| Fill Factor | 85% | 86% |

The model was then used to predict the structures of multijunction solar cells with 4, 5 and 6 subcells that exceed the efficiencies of known best three junction solar cells. The subsequent paragraphs describe more general and more specific embodiments of the invention. In many cases, the structures were constrained to be substantially lattice-matched to GaAs and Ge substrates. All band gap ranges are given to one significant digit to the right of the decimal point. While the simulation predicts optimized structures where the subcells are typically current-matched, other design criteria (e.g., desired solar cell thickness) may lead to the modification of said structures, within the band gap ranges specified below.

Of note is that the embodiments of the invention disclosed below include multijunction solar cells with bottom subcells having band gaps greater than 0.8 eV, up to 1.1 eV. The prior art predominantly teaches that multijunction solar cells with more than 3 subcells should have a bottom subcell with a band gap less than or equal to 0.8 eV, in order to collect light over a broader fraction of the solar spectrum. Most commonly, the material composing the base of the bottom subcell in the prior art is Ge or InGaAs. Surprisingly, however, high efficiencies can be achieved from solar cells of the invention using a bottom III-AsNV subcell that has a band gap as high as 1.1 eV, due at least in part to the higher voltages and efficient current extraction of such subcells.

Another novel aspect of many of the embodiments disclosed below is the inclusion of two or three III-AsNV subcells of differing band gaps in a single multijunction solar cell. In these embodiments, at least one of the III-AsNV subcells has a band gap higher than has been previously achievable or suggested such as, for example, a band gap of 1.3 eV.

Also of note is that certain embodiments have a bottom III-AsNV subcell with a band gap lower than has been previously achievable for a III-AsNV alloy that is substantially lattice-matched to a substrate, such as, for example, a band gap of 0.8 eV.

Figure 15:
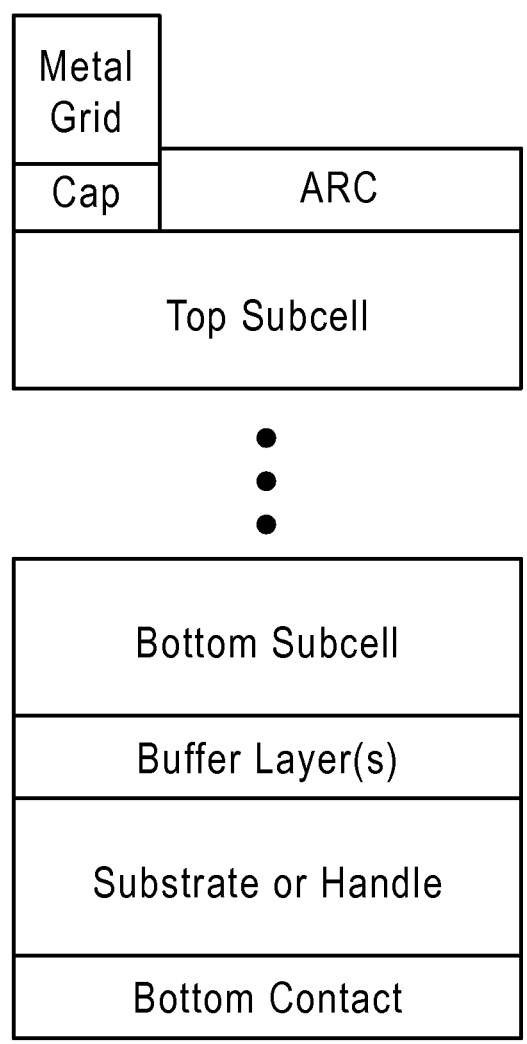
FIG. 15 illustrates elements of a multijunction solar cell device as found in certain embodiments of the invention.

FIGS. 1A-1B, 2A-2B, 3A-3D, 6-7, 9-12, 13A-B, and 15-16, 17B, 18B, and 19B exemplify, in additional detail, certain embodiments of a 4, 5, and 6 multijunction solar cells according to the invention. For simplicity, FIGS. 1A-1B, 2A-2B, 3A-3D, 6-7, 9-12, 13A-B, 17B, 18B, and 19B show only the subcells and interconnecting tunnel junctions of the multijunction solar cells. As is well known to those skilled in the art, additional elements may be necessary to create a complete solar cell, including an anti-reflection coating, contact layers, electrical contacts and a substrate or wafer handle. As will be discussed below, FIG. 15 shows one example structure with these additional elements. Further, additional elements may be present in a complete solar cell, such as buffer layers and additional tunnel junctions. In some of the embodiments disclosed herein, the bottom subcell includes the substrate (e.g., a Ge subcell) and thus the substrate is shown in the figures. In other embodiments, the substrate is not part of a subcell, and is therefore typically not shown in the figures.

FIG. 1A depicts a multijunction solar cell according to the invention that has five subcells, with the bottom subcell being a III-AsNV subcell. All five subcells are substantially lattice-matched to each other and may be interconnected by four tunnel junctions, which are shown as dotted regions. The III-AsNV subcell at the bottom of the stack has the lowest band gap of the five subcells and absorbs the lowest-energy light that is converted into electricity by the solar cell. The band gap of the III-AsNV material in the bottom subcell is between 0.7-1.1 eV. The upper subcells may comprise any suitable III-V, II-VI, or group IV materials, including III-AsNV materials.

FIG. 1B depicts a multijunction solar cell according to the invention that has six subcells, with the bottom subcell being a III-AsNV subcell. All six subcells are substantially lattice-matched to each other and may be interconnected by five tunnel junctions, which are shown as dotted regions. The III-AsNV subcell has the lowest band gap of the six subcells. The band gap of the III-AsNV material in the bottom subcell is between 0.7-1.1 eV. The upper subcells may comprise any suitable III-V, II-VI, or group IV materials, including III-AsNV materials.

In certain embodiments, the band gap of the III-AsNV alloy in a bottom subcell is between 0.8-0.9 eV, and in other embodiments, between 0.9-1.0 eV. In certain embodiments, the composition of the base layer of a bottom III-AsNV subcell comprises $Ga_{1-x}In_xN_yAs_{1-y-z}Sb_z$, in which values for x, y and z are $0 \le x \le 0.24$, $0.01 \le y \le 0.07$ and $0.001 \le z \le 0.20$, in certain embodiments, $0.02 \le x \le 0.24$, $0.01 \le y \le 0.07$ and $0.001 \le z \le 0.03$, in certain embodiments, $0.02 \le x \le 0.18$, $0.01 \le y \le 0.04$ and $0.001 \le z \le 0.03$, and in certain embodiments, $0.06 \le x \le 0.20$, $0.02 \le y \le 0.05$ and $0.005 \le z \le 0.02$.

In the embodiment of the invention illustrated in FIG. 2A, a multijunction solar cell has five subcells, with J4, the subcell directly above the bottom subcell and the fourth subcell from the top, being a III-AsNV subcell. The band gap of the III-AsNV material in J4 is between 0.9-1.3 eV. All five subcells are substantially lattice-matched to each other and may be interconnected by four tunnel junctions, which are shown as dotted regions. The other four subcells may comprise any suitable III-V, II-VI, or group IV materials, including III-AsNV materials.

Figure 2B:
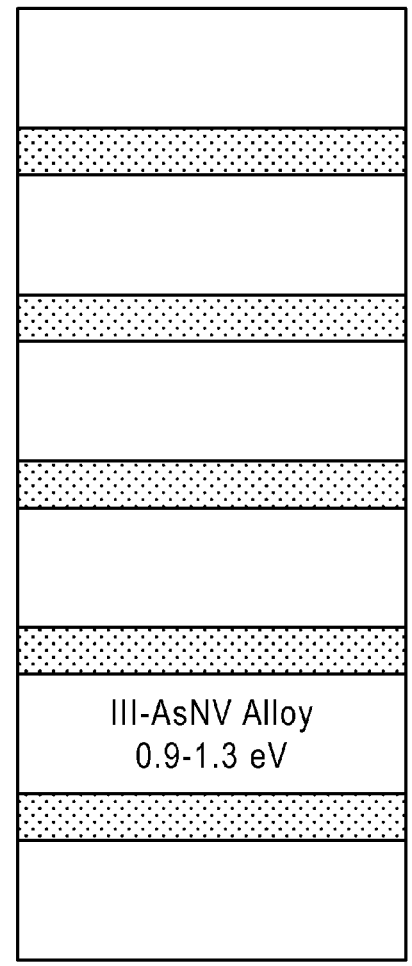
FIG. 2B depicts a schematic cross-section of a multijunction solar cell with six subcells illustrating still another embodiment of the invention.

FIG. 2B shows a multijunction solar cell according to the invention that has six subcells, with J5, the subcell directly above the bottom subcell, being a III-AsNV subcell. The band gap of the III-AsNV material in the base of J5 is between 0.9-1.3 eV. All six subcells are substantially lattice-matched to each other and may be interconnected by five tunnel junctions, which are shown as dotted regions. The other five subcells may comprise any suitable III-V, II-VI or group IV materials, including III-AsNV materials.

In certain embodiments, the band gap of the III-AsNV alloy in the subcell directly above the bottom subcell is between 0.9-1.0 eV, and in certain embodiments, between 1.0-1.1 eV. In certain embodiments, the composition of the base layer of the subcell directly above the bottom subcell comprises $Ga_{1-x}In_xN_yAs_{1-y-z}Sb_z$, in which values for x, y and z are $0 \leq x \leq 0.18$, $0.001 \leq y \leq 0.05$ and $0.001 \leq z \leq 0.15$, in certain embodiments $0 \leq x \leq 0.18$, $0.001 \leq y \leq 0.05$, and $0.001 \leq z \leq 0.03$, and in certain embodiments $0.02 \leq x \leq 0.18$, $0.005 \leq y \leq 0.04$ and $0.001 \leq z \leq 0.03$.

Figure 3A:
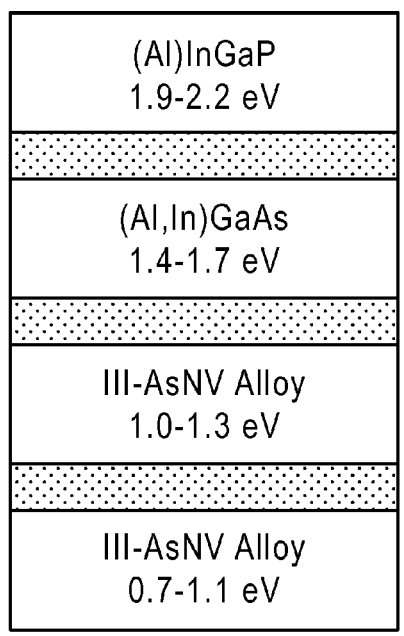
FIG. 3A depicts a schematic cross-section of a multijunction solar cell with four subcells illustrating still another embodiment of the invention.
Figure 3B:
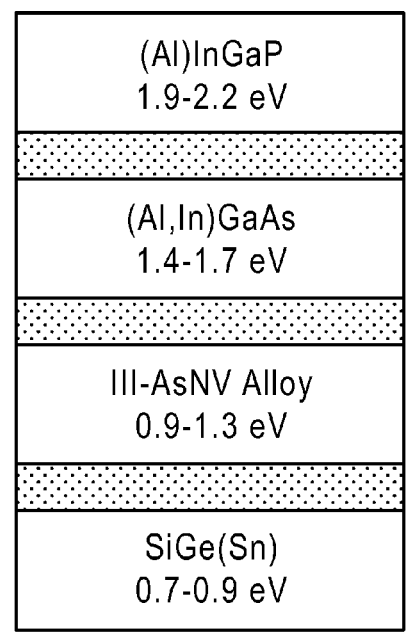
FIG. 3B depicts a schematic cross-section of a multijunction solar cell with four subcells illustrating still another embodiment of the invention.

Another embodiment of the invention is shown in FIG. 3A. In this embodiment, there are four subcells, the two bottom subcells being III-AsNV subcells. The band gap of the bottom subcell, J4, is between 0.7-1.1 eV. The band gap of J3 is between 0.9-1.3 eV, or between 1.0-1.3 eV, and is greater than the band gap of J4. The subcell J2, directly above the two III-AsNV subcells, is an (Al,In)GaAs subcell with a band gap in the range of 1.4-1.7 eV. The top subcell J1 is an (Al)InGaP subcell with a band gap in the range of 1.9-2.2 eV. Examples of band gaps for the subcells, from bottom to top, are respectively 0.8-0.9 eV or 0.9-1.0 eV, 1.1-1.2 eV, 1.5-1.6 eV, and 1.9-2.0 or 2.0-2.1 eV. The band gaps and thicknesses of the subcells are most optimal when the currents produced by the four subcells are substantially the same. All of the subcells are substantially lattice-matched to each other and may be connected in series by tunnel junctions. In a similar embodiment of the invention, the structure is the same except that the subcell directly above the bottom subcell, J3, is a GaInNAs subcell. In another related embodiment, the structure is the same except that J2 is a (Al)GaInPAs subcell. In another, related embodiment that is depicted in FIG. 3B, J4 is a SiGe (Sn) subcell.

Figure 3C:
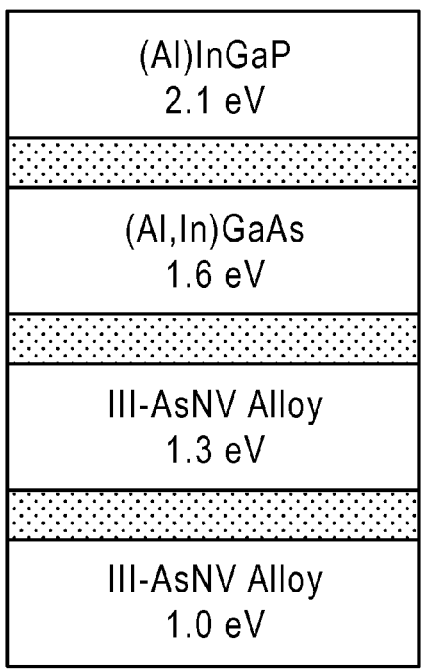
FIG. 3C depicts a schematic cross-section of a multijunction solar cell with four subcells illustrating still another embodiment of the invention.
Figure 3D:
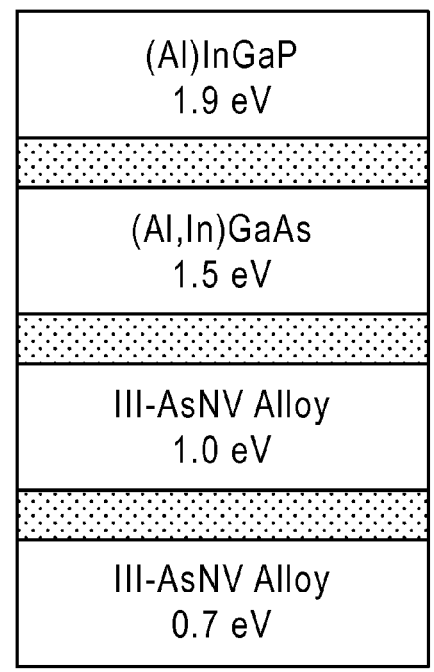
FIG. 3D depicts a schematic cross-section of a multijunction solar cell with four subcells illustrating still another embodiment of the invention.

The specific band gaps of the subcells, within the ranges given in the preceding as well as subsequent embodiments, are dictated by the band gap of the bottom subcell, the thicknesses of the subcell layers, and the incident spectrum of light. Although there are numerous structures in the present disclosure that will produce efficiencies exceeding those of three junction solar cells, it is not the case that any set of subcell band gaps that falls within the disclosed ranges will produce such an efficiency. For a certain choice of bottom subcell band gap, or alternately the band gap of another subcell, incident spectrum of light, subcell materials and subcell layer thicknesses, there is a narrower range of band gaps for the remaining subcells that will produce efficiencies exceeding those of three junction solar cells. The band gaps may be found from the simulation and/or from experimentation. In general, the higher the band gap of the bottom subcell, the higher the band gaps of the upper subcells, within the specified ranges. FIGS. 3C and 3D illustrate this for the embodiment of the invention depicted in FIG. 3A using the AM1.5D spectrum. The band gap of the bottom subcell in FIG. 3C is higher than the band gap of the bottom subcell in FIG. 3D. Accordingly, the band gaps of the upper subcells in FIG. 3C are higher than the band gaps of the upper subcells, respectively, in FIG. 3D.

Figure 4:
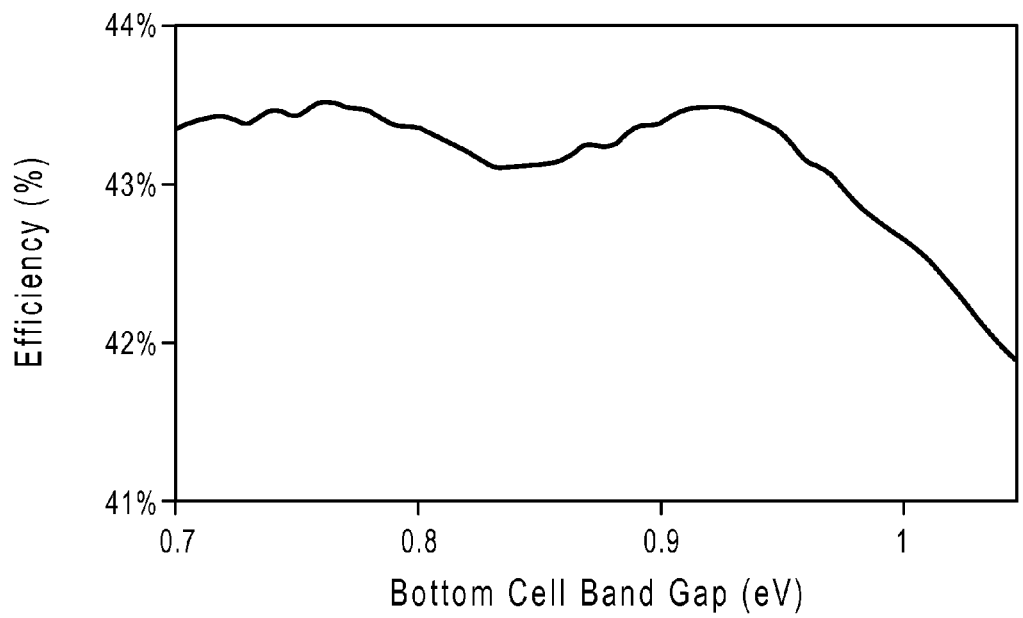
FIG. 4 shows the efficiency as a function of bottom subcell band gap for a specific embodiment of the invention with four subcells under the AM1.5D spectrum at 25° C.

FIG. 4 shows the efficiencies predicted by the simulation as a function of the band gap of the bottom subcell for a specific embodiment of the invention depicted in FIG. 3A, under an illumination intensity of 100 W/cm² or 1000 suns at 25° C. In this embodiment, J4 and J3 are GaInNAsSb subcells with total subcell thicknesses of 2-3 microns, J2 is an (Al)GaAs subcell with a thickness of 4-5 microns and J1 is an (Al)InGaP subcell with a thickness of 1-2 microns. The trend in efficiency with bottom band gap has two peaks, near band gaps of 0.75 eV and 0.92 eV, which is largely a result of the variation in solar spectrum irradiance in the energy range between 0.7 eV and 1 eV. In all cases shown, the efficiency is higher than the simulated efficiency for the state-of-the-art triple junction solar cell structure under the same conditions (40.8%).

Figure 5:
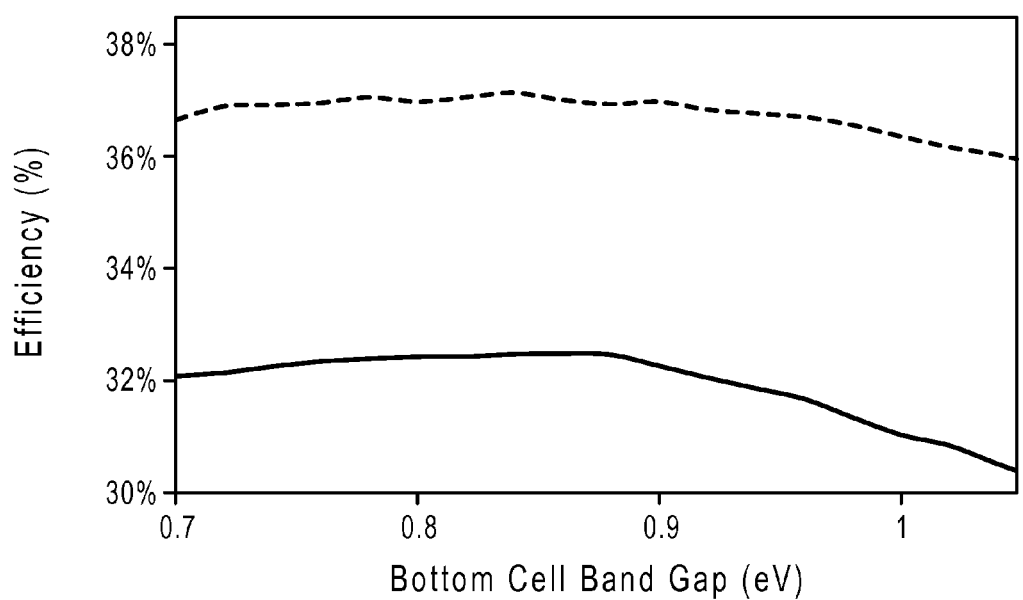
FIG. 5 shows the efficiency as a function of bottom subcell band gap for a specific embodiment of the invention with four subcells under the AM0 spectrum at 25° C.

FIG. 5 shows the efficiencies predicted by the simulation as a function of the band gap of the bottom subcell for a specific embodiment of the invention depicted in FIG. 3A, under the AM0 spectrum at 25° C. In this embodiment, the bottom two subcells are GaInNAsSb subcells with total subcell thicknesses of 2-3 microns, J2 is an (Al)GaAs subcell with a thickness of 3-4 microns and J1 is an (Al)InGaP subcell with a thickness of 0.5-1.5 microns. The solid line shows the efficiencies predicted for solar cells made with today's material parameters, and the dashed line shows predicted future efficiencies with improvements in material quality that increase minority carrier lifetime and improve interface recombination velocities. The trend in today's efficiencies with bottom subcell band gap peaks near 0.90 eV. The efficiency increases as the bottom band gap decreases because more of the solar spectrum is absorbed until the upper band gap limit for the top subcell is reached. At this point, the simulation fixes the top subcell band gap and decreases the top subcell thickness to reach current matching between subcells. This causes the overall efficiency to decrease. In all cases shown, the efficiency is higher than the simulated efficiency for the triple junction solar cell structure under the same conditions.

Another embodiment of the invention has four subcells, with the bottom subcell being a III-AsNV subcell. The band gap of the bottom subcell, J4, is between 0.9-1.1 eV. The subcell J3 is an (Al,In)GaAs or an (Al)GaInPAs subcell with a band gap between 1.4-1.5 eV. The subcell J2 is an Al(In)GaAs or an (Al)GaInPAs subcell with a band gap in the range of 1.6-1.8 eV. The top subcell J1 is an (Al)InGaP subcell with a band gap in the range of 1.9-2.3 eV. Examples of band gaps for the subcells, from bottom to top, are respectively 1.0 eV, 1.4 eV, 1.7 eV, and 2.1 eV.

Figure 6:
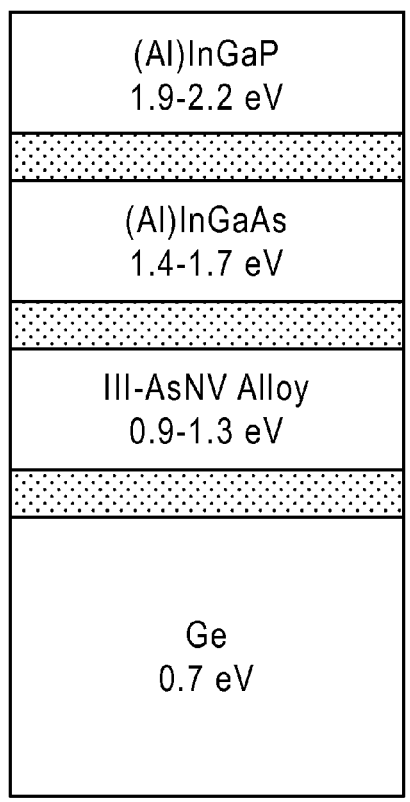
FIG. 6 depicts a schematic cross-section of a multijunction solar cell with four subcells illustrating still another embodiment of the invention.

FIG. 6 illustrates another embodiment of the invention with four subcells. J3, directly above the bottom subcell, is a III-AsNV subcell with a band gap in the range of 0.9 eV-1.3 eV. The bottom subcell is a Ge subcell, incorporating the Ge substrate, which has a band gap of 0.7 eV. J2 is an (Al)InGaAs or (Al)GaInPAs subcell with a band gap in the range of 1.4 eV-1.7 eV. J1 is an (Al)InGaP subcell with a band gap in the range of 1.9 eV-2.2 eV. Examples of band gaps for the subcells above the Ge subcell, from bottom to top, are respectively, 1.0 eV-1.1 eV, 1.4 eV-1.5 eV, and 1.9 eV-2.0 eV. All of the subcells are substantially lattice-matched to the Ge substrate and may be connected in series by tunnel junctions.

Figure 7:
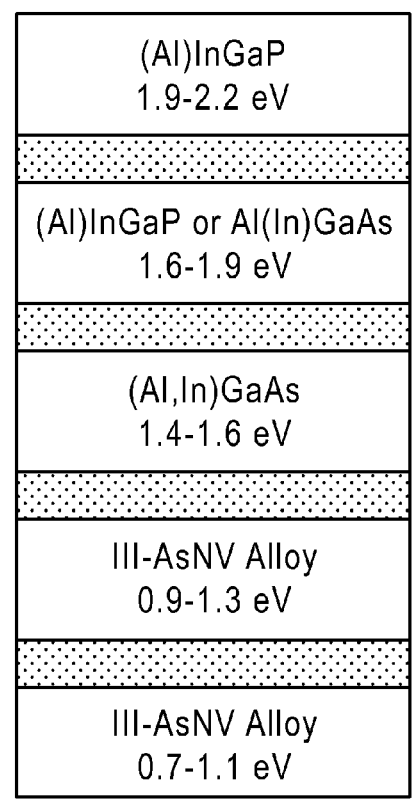
FIG. 7 depicts a schematic cross-section of a multijunction solar cell with five subcells illustrating still another embodiment of the invention.

FIG. 7 depicts an embodiment of the invention with five subcells. The bottom two subcells are III-AsNV subcells. The band gap of the bottom subcell is between 0.7 eV-1.1 eV. The band gap of J4, the subcell second from the bottom, is between 0.9 eV-1.3 eV, or between 1.0-1.3 eV, and is greater than or equal to the band gap of the bottom subcell. J3, the subcell above the III-AsNV subcells, is an (Al,In)GaAs subcell with a band gap in the range of 1.4 eV-1.6 eV. J2 is an Al(In)GaAs or an (Al)InGaP subcell with a band gap in the range of 1.6 eV-1.9 eV. The top subcell is an (Al)InGaP subcell with a band gap in the range of 1.9-2.2 eV. Examples of band gaps for subcells from bottom to top are, respectively, 0.9 eV-1.0 eV, 1.1 eV-1.2 eV, 1.4 eV-1.5 eV, 1.7 eV-1.8, and 1.9 eV-2.1 eV. All of the subcells are substantially lattice-matched to each other and may be connected in series by tunnel junctions. In a related embodiment of the invention, the structure is the same except that J4 is a GaInNAs subcell. In another related embodiment, the structure is the same except that one or both of J2 and J3 is an (Al)GaInPAs subcell. In an additional related embodiment, the bottom subcell is a SiGe(Sn) subcell.

In another embodiment of the invention, the bottom three subcells are III-AsNV subcells. The band gap of the bottom subcell, J5, is between 0.7 eV-1.0 eV. The band gap of J4 is between 0.9 eV-1.2 eV and is greater than the band gap of J5. J3 is a III-AsNV subcell with a band gap in the range of 1.2 eV-1.4 eV. J2 is an Al(In)GaAs, (Al)InGaPAs or InGaP subcell with a band gap in the range of 1.6 eV-1.8 eV. The top subcell, J1, is an (Al)InGaP subcell with a band gap in the range of 1.9 eV-2.2 eV. In certain embodiments, band gaps for the subcells, from bottom to top, respectively, are 0.7 eV-0.8 eV, 0.9 eV-1.1 eV, 1.2 eV-1.3 eV. 1.6 eV-1.7 eV, and 2.0 eV-2.1 eV. The subcells may be substantially lattice-matched to each other and connected in series by tunnel junctions. In a related embodiment of the invention, the structure is the same except J3 and/or J4 is a GaInNAs subcell.

Figure 8:
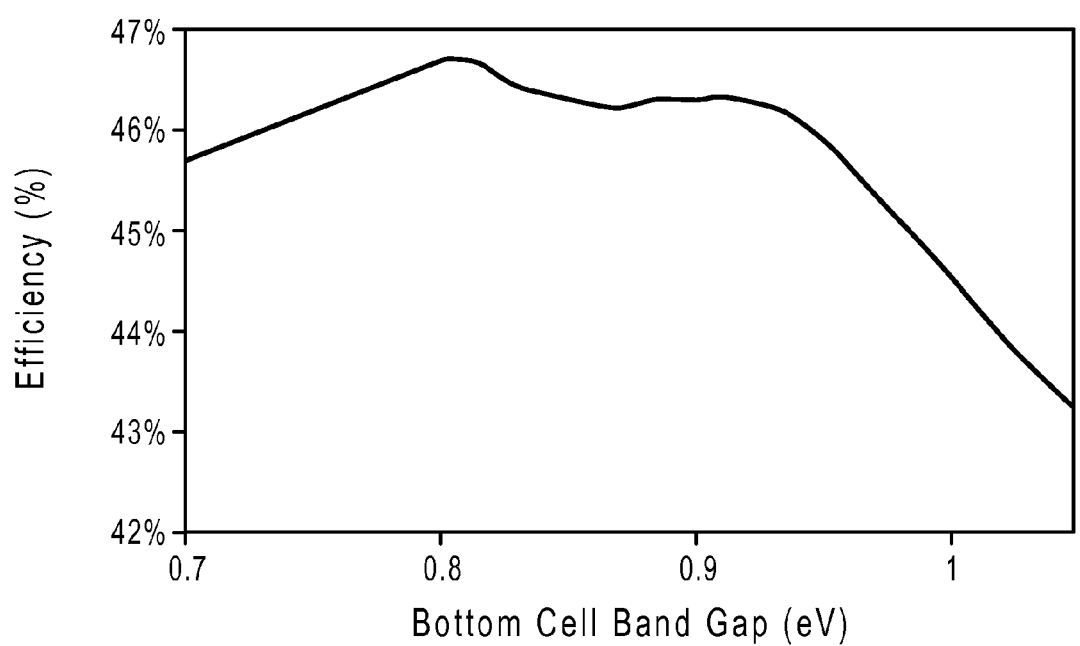
FIG. 8 shows the efficiency as a function of bottom subcell band gap for a specific embodiment of the invention with five subcells.

FIG. 8 shows the efficiencies predicted by the simulation as a function of the band gap of the bottom subcell for a specific embodiment of the invention depicted in FIG. 7 under an illumination intensity of 100 W/cm$^2$ or 1000 suns of the AM1.5D spectrum at 25° C. In this embodiment, the bottom two subcells are GaInNAsSb subcells with total subcell thicknesses of 2-3 microns, J3 and J2 are (Al)GaAs subcells with thicknesses of 4-5 microns and the top subcell is an (Al)InGaP subcell with a thickness up to 1.5 microns. The trend in efficiency with bottom band gap has two peaks, near 0.80 eV and 0.92 eV, which is a result of at least two factors. One is the variation in solar spectrum irradiance in the energy range between 0.7 eV and 1 eV. Another factor is the limitation on composition ($x \leq 0.2$ for $Al_xIn_{0.5}Ga_{1-x}P$) and thus band gap for the AlInGaP subcell. When the band gap reaches the upper limit, the efficiency begins to decrease because the limitation on band gap places a limitation on the solar cell voltage. In all cases shown, the measured efficiency is higher than the simulated efficiency for the state-of-the-art triple junction solar cell structure under the same conditions.

Figure 9:
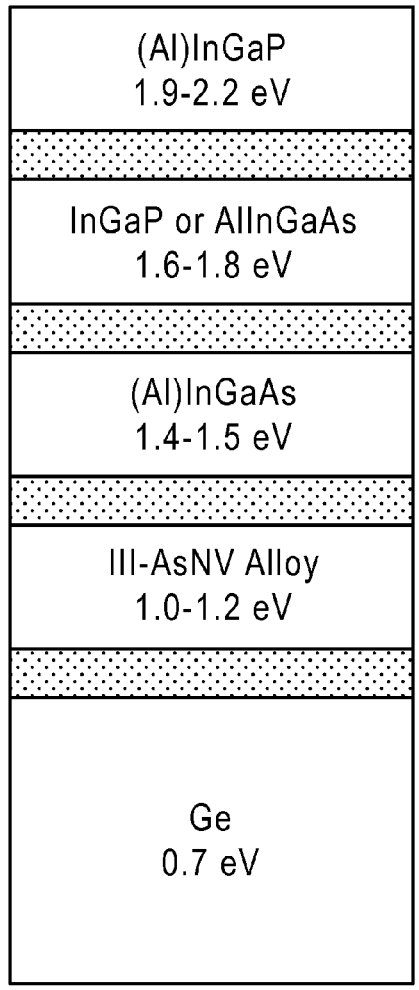
FIG. 9 depicts a schematic cross-section of a multijunction solar cell with five subcells illustrating still another embodiment of the invention.

In FIG. 9 is shown another embodiment of the invention with five subcells. The bottom subcell is a Ge subcell, incorporating the Ge substrate. J4, the subcell directly above the Ge subcell, is a III-AsNV subcell with a band gap between 1.0 eV-1.2 eV. J3, above the III-AsNV subcell, is an (Al)InGaAs subcell with a band gap in the range of 1.4 eV-1.5 eV. J2 is an AlInGaAs or an InGaP subcell with a band gap in the range of 1.6 eV-1.8 eV. J1 is an (Al)InGaP subcell with a band gap in the range of 1.9 eV-2.2 eV. Examples of band gaps for the subcells above the Ge subcell, from the bottom to the top are, respectively, 1.0 eV-1.1 eV, 1.4 eV, 1.6 eV-1.7 eV, and 2.0 eV-2.1 eV. All of the subcells are substantially lattice-matched to each other and may be connected in series by tunnel junctions. In a related embodiment, the structure is the same except that one or both of J2 and J3 is an (Al)GaInPAs subcell.

Figure 10:
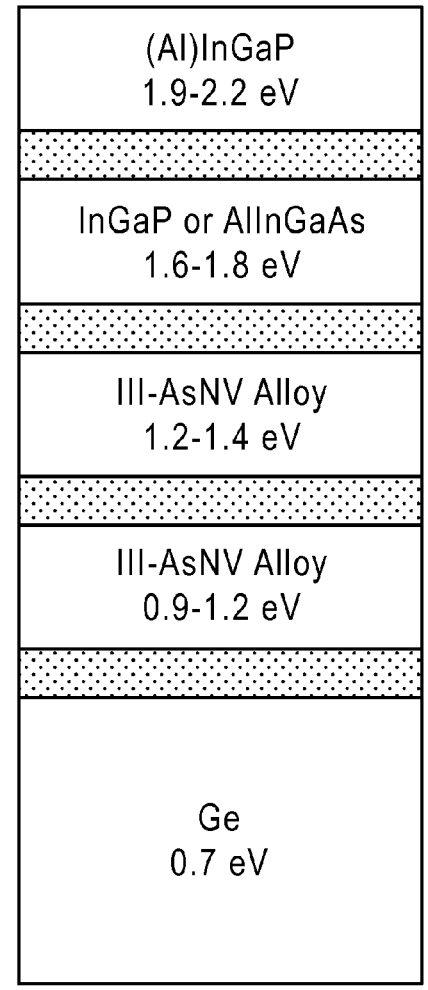
FIG. 10 depicts a schematic cross-section of a multijunction solar cell with five subcells illustrating still another embodiment of the invention.

Yet another embodiment of the invention with five subcells is depicted in FIG. 10. The bottom subcell is a Ge subcell, incorporating the Ge substrate. J4 is a III-AsNV subcell with a band gap between 0.9 eV-1.0 eV or between 1.0 eV-1.2 eV. J3 is a III-AsNV subcell with a band gap in the range of 1.2 eV-1.4 eV. J2 is an AlInGaAs or an InGaP subcell with a band gap in the range of 1.6 eV-1.8 eV. The top subcell is an (Al)InGaP subcell with a band gap in the range of 1.9 eV-2.2 eV. Examples of band gaps for the subcells above the Ge subcell, from bottom to top, are, respectively 1.0 eV-1.1 eV, 1.3 eV, 1.6 eV-1.7 eV and 2.0-2.1 eV. All of the subcells are substantially lattice-matched to each other and may be connected in series by tunnel junctions. In a related embodiment of the invention, the structure is the same except that J3 is a GaInNAs subcell. In another related embodiment, the structure is the same except that J2 is a (Al)GaInPAs subcell.

Embodiments of the invention with six subcells are illustrated in FIGS. 11, 12, 13A, and 13B.

Figure 11:
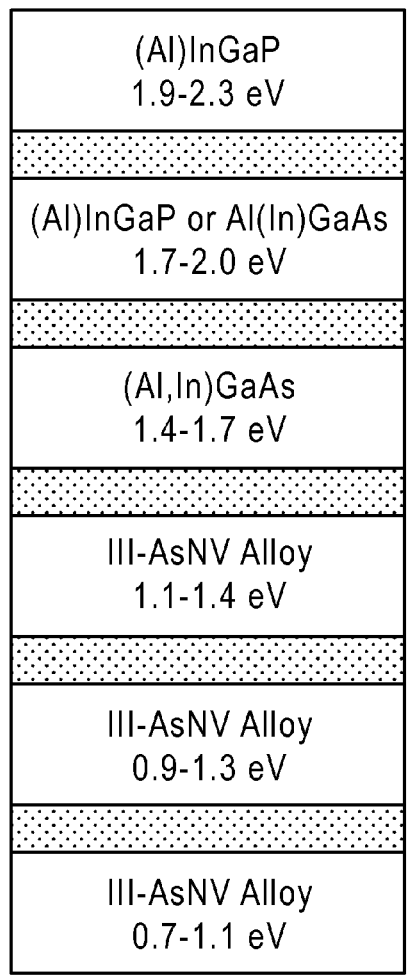
FIG. 11 depicts a schematic cross-section of a multijunction solar cell with six subcells illustrating still another embodiment of the invention.

In FIG. 11, the bottom three subcells are III-AsNV subcells. The band gap of the bottom subcell, J6, is between 0.7 eV-1.1 eV. The band gap of J5 is between 0.9-1.3 eV and is greater than or equal to the band gap of the bottom subcell. The band gap of J4 is between 1.1-1.4 eV and is greater than or equal to the band gap of J5. Above the III-AsNV subcells is J3, which is an (Al,In)GaAs subcell with a band gap in the range of 1.4-1.7 eV. J2 is an Al(In)GaAs or an (Al)InGaP subcell with a band gap in the range of 1.7-2.0 eV. The top subcell is an (Al)InGaP subcell with a band gap in the range of 1.9-2.2 eV or 2.2-2.3 eV. Examples of band gaps for the subcells from bottom to top are, respectively, 0.9-1.0 eV, 1.1-1.2 eV, 1.3-1.4 eV, 1.5-1.6 eV, 1.8-1.9 eV, and 2.0-2.1 eV. As another example, the band gaps of the subcells from bottom to top are, respectively, 0.7-0.8 eV, 0.9-1.0 eV, 1.1-1.2 eV, 1.4-1.5 eV, 1.7-1.8 eV, and 2.1-2.2 eV. All of the subcells are substantially lattice-matched to each other and may be connected in series by tunnel junctions. In a related embodiment of the invention, the structure is the same except that one or both of J4 and J5 are GaInNAs subcell(s). In a related embodiment, the structure is the same except that one or both J2 and J3 is a (Al)GaInPAs subcell. In an additional related embodiment, the structure is the same except the bottom subcell is a SiGe(Sn) subcell.

Figure 14:
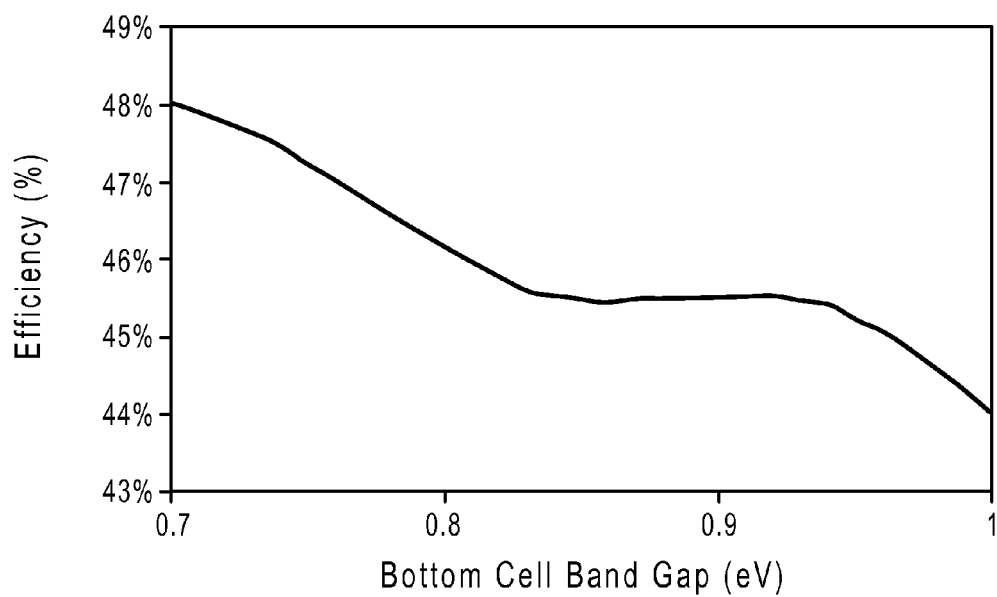
FIG. 14 shows the efficiency as a function of bottom subcell band gap for a specific embodiment of the invention with six subcells.

FIG. 14 shows the efficiencies predicted by the simulation as a function of the band gap of the bottom subcell for a specific embodiment of the invention depicted in FIG. 11 under an illumination intensity of 100 W/cm$^2$ or 1000 suns under the AM1.5D spectrum at 25° C. In this embodiment, the three bottom subcells are GaInNAsSb subcells each with a total subcell thicknesses of 2-3 microns, the J2 and J3 are (Al)GaAs subcells each with a thickness of 4-5 microns, and J1 is an (Al)InGaP subcell with a thickness up to 1.5 microns. In all cases shown, the efficiency is higher than the simulated efficiency for the state-of-the-art triple junction solar cell structure under the same conditions.

Figure 12:
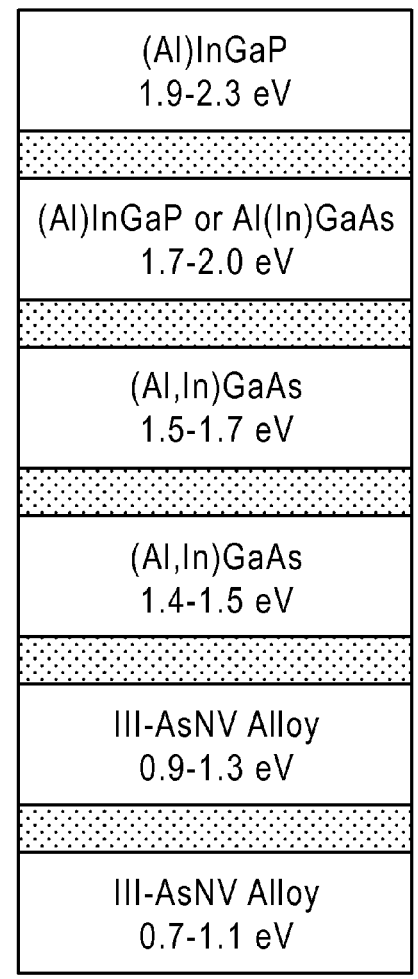
FIG. 12 depicts a schematic cross-section of a multijunction solar cell with six subcells illustrating still another embodiment of the invention.

In FIG. 12, the bottom two subcells are III-AsNV subcells. The band gap of the bottom subcell, J6, is between 0.7-1.1 eV. The band gap of J5 is between 0.9-1.3 eV and is greater than or equal to the band gap of J6. The band gap of J4 is between 1.4-1.5 eV and it is an (Al,In)GaAs subcell. J3 is an (Al,In)GaAs subcell with a band gap in the range of 1.5-1.7 eV. J2 is an Al(In)GaAs or an (Al)InGaP subcell with a band gap in the range of 1.7-2.0 eV. J1 is an (Al)InGaP subcell with a band gap in the range of 1.9-2.2 eV or 2.2-2.3 eV. Examples of band gaps for the subcells, from bottom to top, are, respectively, 0.9-1.0 eV, 1.1-1.2 eV, 1.4 eV, 1.6-1.7 eV, 1.8-1.9 eV, and 2.0-2.1 eV. All of the subcells are substantially lattice-matched to each other and may be connected in series by tunnel junctions. In a related embodiment of the invention, the structure is the same except that J5 is a GaInNAs subcell. In a related embodiment, the structure of a photovoltaic cell is the same as in FIG. 12 except that one or more of J2, J3, and J4 is a (Al)GaInPAs subcell. In an additional related embodiment, the bottom subcell is a SiGe(Sn) subcell.

Figure 13A:
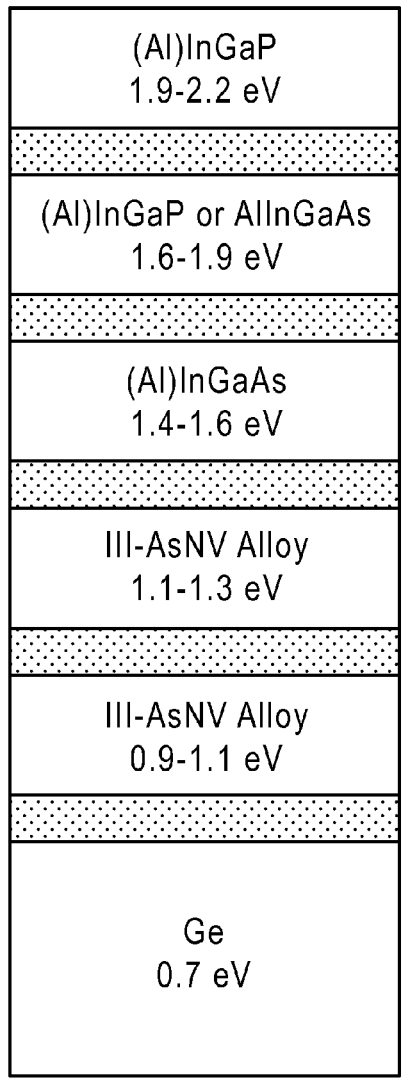
FIG. 13A depicts a schematic cross-section of a multijunction solar cell with six subcells illustrating still another embodiment of the invention.
Figure 13B:
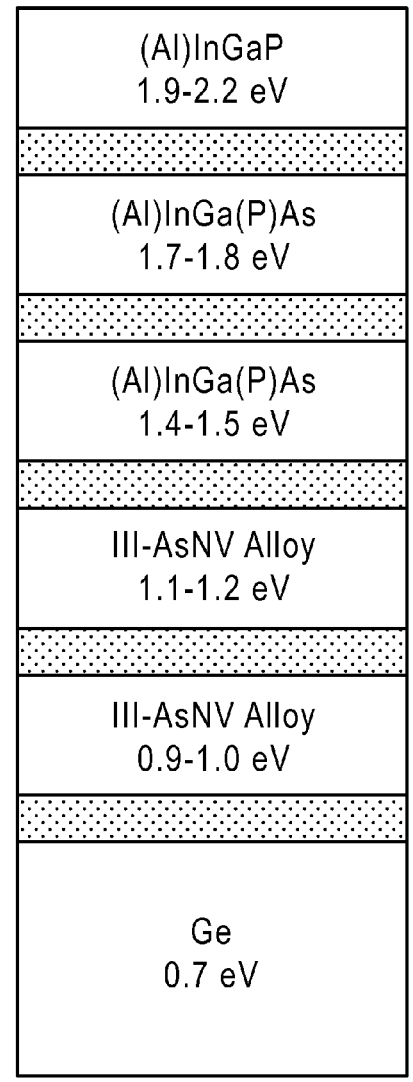
FIG. 13B depicts a schematic cross-section of a multijunction solar cell with six subcells illustrating still another embodiment of the invention.

FIG. 13A depicts an embodiment of the invention where the bottom subcell comprises the Ge substrate. J4 and J5 are III-AsNV subcells. The band gap of J5 is between 0.9-1.1 eV. The band gap of J4 is between 1.1-1.3 eV and is greater than or equal to the band gap of the bottom subcell. J3 is an (Al)InGaAs subcell with a band gap in the range of 1.4-1.6 eV. J2 is an AlInGaAs or an (Al)InGaP subcell with a band gap in the range of 1.6-1.9 eV. The top subcell is an (Al)InGaP subcell with a band gap in the range of 1.9-2.2 eV or 2.2-2.3 eV. Examples of band gaps for J5 to J1 are, respectively, 0.9-1.0 eV, 1.1-1.2 eV, 1.4-1.5 eV, 1.7-1.8 eV, and 2.0-2.1 eV. All of the subcells are substantially lattice-matched to each other and may be connected in series by tunnel junctions. In a related embodiment of the invention, the structure of a photovoltaic cell is the same as depicted in FIG. 13A except that J4 is a GaInNAs subcell. In a related embodiment to the above-described certain embodiment, one or both of the J2 and J3 is a (Al)InGaPAs subcell. This embodiment is depicted in FIG. 13B.

In certain of the embodiments described herein, including any of the photovoltaic cells shown in FIG. 1A-B, 2A-B, 3A, 3C-D, 7, 11-12, 15, 16, or 17B, a bottom III-AsNV subcell is a GaInNAsSb subcell with a base layer comprising $Ga_{1-x}In_xN_yAs_{1-y-z}Sb_z$, in which values for x, y, and z are $0 \leq x \leq 0.24$, $0.01 \leq y \leq 0.07$ and $0.001 \leq z \leq 0.20$; in certain embodiments, $0.02 \leq x \leq 0.24$, $0.01 \leq y \leq 0.07$ and $0.001 \leq z \leq 0.03$; in certain embodiments, $0.02 \leq x \leq 0.18$, $0.01 \leq y \leq 0.04$ and $0.001 \leq z \leq 0.03$; in certain embodiments, $0.08 \leq x \leq 0.18$, $0.025 \leq y \leq 0.04$ and $0.001 \leq z \leq 0.03$; and in certain embodiments, $0.06 \leq x \leq 0.20$, $0.02 \leq y \leq 0.05$ and $0.005 \leq z \leq 0.02$.

In certain of the embodiments described herein, including any of the photovoltaic cells shown in FIG. 1A-B, 2A-B, 3A-D, 6, 7, 9-13, 15, 16, 17B, 18B, or 19B, a III-AsNV subcell directly above the bottom subcell is a GaInNAsSb subcell with a base layer comprising $Ga_{1-x}In_xN_yAs_{1-y-z}Sb_z$, in which values for x, y, and z are $0 \leq x \leq 0.18$, $0.001 \leq y \leq 0.05$ and $0.001 \leq z \leq 0.15$, and in certain embodiments, $0 \leq x \leq 0.18$, $0.001 \leq y \leq 0.05$ and $0.001 \leq z \leq 0.03$; in certain embodiments, $0.02 \leq x \leq 0.18$, $0.005 \leq y \leq 0.04$ and $0.001 \leq z \leq 0.03$; in certain embodiments, $0.04 \leq x \leq 0.18$, $0.01 \leq y \leq 0.04$ and $0.001 \leq z \leq 0.03$; in certain embodiments, $0.06 \leq x \leq 0.18$, $0.015 \leq y \leq 0.04$ and $0.001 \leq z \leq 0.03$; and in certain embodiments, $0.08 \leq x \leq 0.18$, $0.025 \leq y \leq 0.04$ and $0.001 \leq z \leq 0.03$.

In certain of the embodiments described herein, including any of the photovoltaic cells shown in FIG. 1A-B, 2A-B, 10-11, 13A-B, 15, or 19B, a III-AsNV subcell that is the third from the bottom (e.g., J4 in a six junction solar cell or J3 in a five junction solar cell) is a GaInNAsSb subcell with a base layer comprising $Ga_{1-x}In_xN_yAs_{1-y-z}Sb_z$, in which values for x, y, and z are $0 \leq x \leq 0.12$, $0.001 \leq y < 0.03$ and $0.001 \leq z \leq 0.10$; in certain embodiments, $0 \leq x \leq 0.12$, $0.001 \leq y < 0.03$ and $0.001 \leq z \leq 0.03$; in certain embodiments, $0.02 \leq x \leq 0.10$, $0.005 \leq y \leq 0.02$ and $0.001 \leq z \leq 0.02$; in certain embodiments, $0.01 \leq x \leq 0.06$, $0.005 \leq y \leq 0.015$ and $0.001 \leq z \leq 0.02$; and in certain embodiments, $0.01 \leq x \leq 0.08$, $0.005 \leq y \leq 0.025$ and $0.001 \leq z \leq 0.02$.

In each of the embodiments described herein, the tunnel junctions are designed to have minimal light absorption. Light absorbed by tunnel junctions is not converted into electricity by the solar cell, and thus if the tunnel junctions absorb significant amounts of light, it will not be possible for the efficiencies of the multijunction solar cells to exceed those of the best triple junction solar cells. Accordingly, the tunnel junctions must be very thin (preferably less than 40 nm) and/or be made of materials with band gaps equal to or greater than the subcells immediately above them. An example of a tunnel junction fitting these criteria is a GaAs/AlGaAs tunnel junction, where each of the GaAs and AlGaAs layers forming a tunnel junction have a thickness of between 5- and 15 nm. The GaAs layer is doped with Te, Se, S and/or Si, and the AlGaAs layer is doped with C.

In each of the embodiments described and illustrated herein, additional elements are present in order to create a solar cell device. Specifically, cap or contact layer(s), anti-reflection coating (ARC) layers and electrical contacts (also denoted the "metal grid") are typically formed above the top subcell, and buffer layer(s), the substrate or handle, and bottom contacts are typically formed or exist below the bottom subcell. In certain embodiments, the substrate may be part of the bottom subcell, such as in a Ge subcell. Other elements, such as additional tunnel junctions, may also be present. Devices may also be formed without all of the elements listed above, as known to those skilled in the art. An example illustrating these typical additional elements, and their typical positions relative to the top and bottom subcells, is shown in FIG. 15.

A structural example depicting the individual layers that may compose a multijunction solar cell with four subcells according to the invention is shown in detail in FIG. 16 and described herein. In operation, a multijunction cell is configured such that the subcell having the highest bandgap faces the incident solar radiation, with subcells characterized by increasingly lower band gaps situated underneath.

In the embodiments disclosed herein, each subcell may comprise several layers. For example, each subcell may comprise a window layer, an emitter, a base, and a back surface field (BSF) layer. As shown in FIG. 16, the window layer is above the emitter layer, which is above the base, which is above the BSF.

In operation, the window layer is the topmost layer of a subcell and faces the incident solar radiation. In certain embodiments, the thickness of a window layer is from about 10 nm to about 500 nm, from about 10 nm to about 300 nm, from about 10 nm to about 150 nm, and in certain embodiments, from about 10 nm to about 50 nm. In certain embodiments, the thickness of a window layer is from about 50 nm to about 350 nm, from about 100 nm to about 300 nm, and in certain embodiments, from about 50 nm to about 150 nm.

In certain embodiments, the thickness of an emitter layer is from about 10 nm to about 300 nm, from about 20 nm to about 200 nm, from about 50 nm to about 200 nm, and in certain embodiments, from about 75 nm to about 125 nm.

In certain embodiments, the thickness of a base layer is from about 0.1 µm to about 6 µm, from about 0.1 µm to about 4 µm, from about 0.1 µm to about 3 µm, from about 0.1 µm to about 2 µm, and in certain embodiments, from about 0.1 µm to about 1 µm. In certain embodiments, the thickness of a base layer is from about 0.5 µm to about 5 µm, from about 1 µm to about 4 µm, from about 1.5 µm to about 3.5 µm, and in certain embodiments, from about 2 µm to about 3 µm.

In certain embodiments the thickness of a BSF layer is from about 10 nm to about 500 nm, from about 50 nm to about 300 nm, and in certain embodiments, from about 50 nm to about 150 nm.

In certain embodiments, an (Al)InGaP subcell comprises a window comprising AlInP, an emitter comprising (Al)InGaP, a base comprising (Al)InGaP, and a back surface field layer comprising AlInGaP.

In certain embodiments, an (Al)InGaP subcell comprises a window comprising AlInP having a thickness from 10 nm to 50 nm, an emitter comprising (Al)InGaP having a thickness from 20 nm to 200 nm, a base comprising (Al)InGaP having a thickness from 0.1 µm to 2 µm, and a BSF layer comprising AlInGaP having a thickness from 50 nm to 300 nm.

In certain of such embodiments, an (Al)InGaP subcell is characterized by a band gap from about 1.9 eV to about 2.2 eV.

In certain embodiments, an (Al,In)GaAs subcell comprises a window comprising (Al)In(Ga)P or Al(In)GaAs, an emitter comprising (Al)InGaP or (Al,In)GaAs, a base comprising (Al,In)GaAs, and a BSF layer comprising Al(In)GaAs or (Al)InGaP. In certain embodiments, an (Al,In)GaAs subcell comprises a window comprising (Al)InGaP having a thickness from 50 nm to 400 nm, an emitter comprising (Al,In)GaAs having a thickness from 100 nm to 200 nm, a base comprising (Al,In)GaAs having a thickness from 1 µm to 4 µm, and a BSF layer comprising Al(In)GaAs having a thickness from 100 nm to 300 nm.

In certain embodiments, an (Al,In)GaAs subcell comprises a window comprising (Al)InGaP having a thickness from 200 nm to 300 nm, an emitter comprising (Al,In)GaAs having a thickness from 100 nm to 150 nm, a base comprising (Al,In)GaAs having a thickness from 2 µm to 3.5 µm, and a BSF layer comprising Al(In)GaAs having a thickness from 150 nm to 250 nm.

In certain of such embodiments, an (Al,In)GaAs subcell is characterized by a band gap from about 1.4 eV to about 1.7 eV.

In certain embodiments, an (Al)GaInPAs subcell comprises a window comprising (Al)In(Ga)P, an emitter comprising (Al)InGaP or (Al)GaInPAs, a base comprising (Al)GaInPAs, and a BSF layer comprising Al(In)GaAs or (Al)InGaP. In certain embodiments, an (Al)GaInPAs subcell comprises a window comprising (Al)In(Ga)P having a thickness from 50 nm to 300 nm, an emitter comprising (Al)InGaP or (Al)GaInPAs having a thickness from 100 nm to 200 nm, a base comprising (Al)GaInPAs having a thickness from 0.5 µm to 4 µm, and a BSF layer comprising Al(In)GaAs or (Al)InGaP having a thickness from 50 nm to 300 nm.

In certain of such embodiments, an (Al)GaInPAs subcell is characterized by a band gap from about 1.4 eV to about 1.8 eV.

In certain embodiments, a III-AsNV alloy subcell comprises a window comprising InGaP or (Al,In)GaAs, an emitter comprising (In)GaAs or a III-AsNV alloy, a base comprising a III-AsNV alloy, and a BSF layer comprising (In)GaAs.

In certain embodiments, a III-AsNV alloy subcell comprises a window comprising InGaP or (In)GaAs, having a thickness from 0 nm to 300 nm, an emitter comprising (In)GaAs or a III-AsNV alloy having a thickness from 100 nm to 200 nm, a base comprising a III-AsNV alloy having a thickness from 1 µm to 4 µm, and a BSF layer comprising (In)GaAs having a thickness from 50 nm to 300 nm. In certain embodiments, a III-AsNV alloy subcell comprises an emitter comprising InGaAs or a III-AsNV alloy having a thickness from 100 nm to 150 nm, a base comprising a III-AsNV alloy having a thickness from 2 µm to 3 µm, and a BSF layer comprising (In)GaAs having a thickness from 50 nm to 200 nm.

In certain of such embodiments, a III-AsNV subcell is characterized by a band gap from about 0.7 to about 1.1 eV, or about 0.9 eV to about 1.3 eV. In certain of such embodiments, the III-AsNV subcell is a GaInNAsSb subcell.

In certain of such embodiments, a III-AsNV subcell has a compressive strain of less than 0.6%, meaning that the in-plane lattice constant of the III-AsNV material in its fully relaxed state is between 0.0% and 0.6% greater than that of the substrate. In certain of such embodiments, the III-AsNV subcell contains Sb and does not contain Bi.

In certain embodiments, a SiGe(Sn) subcell is characterized by a band gap from about 0.7 eV to about 0.9 eV. In certain embodiments, a SiGe(Sn) subcell comprises a window comprising InGaP or (In)GaAs, having a thickness from 0 nm to 300 nm, an emitter comprising (In)GaAs or a III-AsNV alloy having a thickness from 50 nm to 500 nm, and a base comprising SiGe(Sn) having a thickness from 1 µm to 20 µm. In some embodiments, the subcell also comprises a BSF layer comprising (In)GaAs or SiGe(Sn) having a thickness from 50 nm to 300 nm.

In certain embodiments, a Ge subcell comprises a window comprising InGaP or (In)GaAs, having a thickness from 0 nm to 300 nm, an emitter comprising (In)GaAs, (Al,Ga)InP, or a III-AsNV alloy, having a thickness from 10 nm to 500 nm, and a base comprising the Ge substrate. It is to be noted that solar cells disclosed by the invention may also be formed on a Ge substrate wherein the substrate is not part of a subcell.

In certain embodiments, one or more of the subcells has an emitter and/or a base in which there is a graded doping profile. The doping profile may be linear, exponential or with other dependence on position. In certain of such embodiments, one or more of the III-AsNV subcells has an exponential or linear doping profile over part or all of the base, with the doping levels between $1 \times 10^{15}$ and $1 \times 10^{19}$ cm$^{-3}$, or between $1 \times 10^{16}$ and $5 \times 10^{18}$ cm$^{-3}$. Further, the region of the III-AsNV base that is closest to the emitter may have constant or no doping, as disclosed, for example, in U.S. patent application Ser. No. 12/914,710, which is incorporated by reference. Typical dopants include, for example, Be, Mg, Zn, Te, Se, Si, C, and others known in the art.

As shown in FIG. 16, a tunnel junction may be disposed between each of the subcells. Each tunnel junction comprises two or more layers that electrically connect adjacent subcells. The tunnel junction includes a highly doped n-type layer adjacent to a highly doped p-type layer to form a p-n junction. Typically, the doping levels in a tunnel junction are between $10^{18}$ cm$^{-3}$ and $10^{21}$ cm$^{-3}$.

In certain embodiments, a tunnel junction comprises an n-type (In)GaAs or InGaP(As) layer and a p-type (Al,In)GaAs layer. In certain embodiments the dopant of the n-type layer comprises Si and the dopant of the p-type layer comprises C. A tunnel junction may have a thickness less than about 100 nm, less than 80 nm, less than 60 nm, less than 40 nm, and in certain embodiments, less than 20 nm. For example, in certain embodiments, a tunnel junction between (Al)InGaP subcells, between an (Al)InGaP subcell and an (Al,In)GaAs or (Al)GaInPAs subcell, or between (Al,In)GaAs subcells may have a thickness less than about 30 nm, less than about 20 nm, less than about 15 nm, and in certain embodiments, less than about 12 nm. In certain embodiments, a tunnel junction separating an (Al,In)GaAs and III-AsNV alloy subcell, separating adjacent III-AsNV alloy subcells, or separating a III-AsNV alloy and a SiGe(Sn) or Ge subcell may have a thickness less than 100 nm, less than 80 nm, less than 60 nm, and in certain embodiments, less than 40 nm.

A multijunction solar cell may be fabricated on a substrate such as a Ge substrate. In certain embodiments, the substrate comprises GaAs, InP, Ge, or Si. In certain embodiments, all of the subcells are substantially lattice-matched to the substrate. In certain embodiments, one or more of the layers that are included within the completed solar cell but are not part of a subcell such as, for example, anti-reflective coating layers, contact layers, cap layers, tunnel junction layers, and buffer layers, are not substantially lattice-matched to the subcells.

In certain embodiments, a buffer layer is fabricated overlying the substrate. In certain embodiments, the buffer layer comprises (In)GaAs.

As shown in FIG. 16, the multijunction solar cell comprises subcells characterized by progressively higher band gaps overlying the buffer layer, with each of the subcells typically separated by a tunnel junction.

In certain embodiments, the multijunction solar cell comprises an anti-reflection coating overlying the uppermost subcell. The materials comprising the anti-reflection coating and the thickness of the anti-reflection coating are selected to improve the efficiency of light capture in the multijunction solar cell. In certain embodiments, one or more contact layers overlie the uppermost subcell in the regions underlying or near the metal grid. In certain embodiments, the contact layers comprise (In)GaAs and the dopant may be Si or Be.

In certain embodiments, a photovoltaic cell comprises at least four subcells, wherein: the at least four subcells comprise at least one subcell comprising a base layer, wherein the base layer comprises an alloy of elements from group III on the periodic table, nitrogen, arsenic, and at least one element selected from Sb and Bi; and each of the at least four subcells is substantially lattice matched to each of the other subcells.

In certain embodiments of a photovoltaic cell, each of the at least four subcells is substantially lattice matched to a material selected from Si, Ge, SiGe, GaAs, and InP.

In certain embodiments of a photovoltaic cell, the at least one subcell is characterized by a bandgap selected from 0.7 eV to 1.1 eV, from 0.9 eV to 1.0 eV, from 0.9 eV to 1.3 eV, from 1.0 eV to 1.1 eV from 1.0 eV to 1.2 eV, from 1.1 eV to 1.2 eV, from 1.1 eV to 1.4 eV, and from 1.2 eV to 1.4 eV.

In certain embodiments of a photovoltaic cell, the base layer of the at least one subcell comprises $Ga_{1-x}In_xN_yAs_{1-y-z}Sb_z$, in which values for x, y and z are $0 \leq x \leq 0.24$, $0.001 \leq y \leq 0.07$ and $0.001 \leq z \leq 0.20$.

In certain embodiments of a photovoltaic cell, the base layer of the at least one subcell comprises $Ga_{1-x}In_xN_yAs_{1-y-z}Sb_z$, in which values for x, y and z are $0.01 \leq x \leq 0.18$, $0.005 \leq y \leq 0.05$, and $0.001 \leq z \leq 0.03$.

In certain embodiments of a photovoltaic cell, the at least four subcells comprise at least two subcells, each of the at least two subcells comprising a base layer comprising an alloy of elements from group III on the periodic table, nitrogen, arsenic, and at least one element selected from Sb and Bi.

In certain embodiments of a photovoltaic cell, one of the at least two subcells is characterized by a first band gap of 0.7 to 1.1 eV; and a second of the at least two subcells is characterized by a second band gap of 0.9 to 1.3 eV, wherein the second band gap is greater than the first band gap.

In certain embodiments of a photovoltaic cell, each of the at least two subcells comprise a base layer comprising a material independently selected from GaInNAsSb, GaInNAsBi, GaInNAsSbBi, GaNAsSb, GaNAsBi, and GaNAsSbBi.

In certain embodiments of a photovoltaic cell, one of the at least two subcells comprises a base layer comprising $Ga_{1-x}In_xN_yAs_{1-y-z}Sb_z$, in which values for x, y and z are $0.02 \leq x \leq 0.24$, $0.015 \leq y \leq 0.07$ and $0.001 \leq z \leq 0.03$ and a second of the at least two subcells comprises a base layer comprising $Ga_{1-x}In_xN_yAs_{1-y-z}Sb_z$, in which values for x, y and z are $0 \leq x \leq 0.18$, $0.005 \leq y \leq 0.05$ and $0.001 \leq z \leq 0.03$.

In certain embodiments of a photovoltaic cell, the photovoltaic cell comprises a first subcell comprising a first base layer comprising a material selected from Ge, SiGe(Sn), and an alloy of elements from group III on the periodic table, nitrogen, arsenic, and at least one element selected from Sb and Bi, and characterized by a band gap of 0.7 eV to 1.1 eV; a second subcell comprising a second base layer overlying the first subcell, wherein the second base layer comprises an alloy of elements from group III on the periodic table, nitrogen, arsenic, and at least one element selected from Sb and Bi, and characterized by a band gap of 0.9 eV to 1.3 eV; a third subcell comprising a third base layer overlying the second subcell, the third base layer comprising a material selected from GaInPAs and (Al,In)GaAs and characterized by a band gap from 1.4 eV to 1.7 eV; and a fourth subcell comprising a fourth base layer overlying the third subcell, the fourth base layer comprising (Al)InGaP and characterized by a band gap from 1.9 eV to 2.2 eV.

In certain embodiments of a photovoltaic cell, the first base layer, the second base layer, or both the first and the second base layer comprises the alloy $Ga_{1-x}In_xN_yAs_{1-y-z}Sb_z$, in which values for x, y and z are $0 \leq x \leq 0.24$, $0.001 \leq y \leq 0.07$ and $0.001 \leq z \leq 0.20$.

In certain embodiments of a photovoltaic cell, the band gap of the first base layer is 0.7 to 0.9 eV, the band gap of the second base layer is 1.0 to 1.2 eV, the band gap of the third base layer is 1.5 to 1.6 eV, and the band gap of the fourth base layer is 1.9 eV to 2.1 eV.

In certain embodiments of a photovoltaic cell, the first base layer, the second base layer, or both the first and the second base layer comprises the alloy $Ga_{1-x}In_xN_yAs_{1-y-z}Sb_z$, in which values for x, y and z are $0.01 \leq x \leq 0.18$, $0.005 \leq y \leq 0.05$, and $0.001 \leq z \leq 0.03$.

In certain embodiments of a photovoltaic cell, each of the four subcells is substantially lattice matched to a material selected from Ge and GaAs.

In certain embodiments of a photovoltaic cell, the photovoltaic cell comprises a first subcell comprising a first base layer comprising a material selected from the group consisting of Ge, SiGe(Sn), and an alloy of elements from group III on the periodic table, nitrogen, arsenic, and at least one element selected from Sb and Bi, and characterized by a band gap of 0.7 eV to 1.1 eV; a second subcell comprising a second base layer overlying the first subcell, wherein the second base layer comprises an alloy of elements from group III on the periodic table, nitrogen, arsenic, and at least one element selected from Sb and Bi, and characterized by a band gap of 0.9 eV to 1.3 eV; a third subcell comprising a third base layer overlying the second subcell, wherein the second base layer comprises a material selected from GaInPAs, (Al,In)GaAs, and an alloy of elements from group III on the periodic table, nitrogen, arsenic, and at least one element selected from Sb and Bi, and characterized by a band gap of 1.2 eV to 1.6 eV; a fourth subcell comprising a fourth base layer overlying the third subcell, the fourth base layer comprising a material selected from GaInPAs and (Al,In)GaAs and characterized by a band gap from 1.6 eV to 1.9 eV; and a fifth subcell comprising a fifth base layer overlying the fourth subcell, the fifth base layer comprising (Al)InGaP and characterized by a band gap from 1.9 eV to 2.2 eV.

In certain embodiments of a photovoltaic cell comprising five subcells, one or more of the first base layer, the second base layer, and the third base layer comprise the alloy $Ga_{1-x}In_xN_yAs_{1-y-z}Sb_z$, in which values for x, y and z are $0 \leq x \leq 0.24$, $0.001 \leq y \leq 0.07$ and $0.001 \leq z \leq 0.20$. In certain of such embodiments, one or more of the first base layer, the second base layer, and the third base layer comprise the alloy $Ga_{1-x}In_xN_yAs_{1-y-z}Sb_z$, in which values for x, y and z are $0.01 \leq x \leq 0.18$, $0.005 \leq y \leq 0.05$, and $0.001 \leq z \leq 0.03$.

In certain embodiments of a photovoltaic cell, the photovoltaic cell comprises a first subcell comprising a first base layer comprising a material selected from Ge, SiGe(Sn), and an alloy of elements from group III on the periodic table, nitrogen, arsenic, and at least one element selected from Sb and Bi, and characterized by a band gap of 0.7 eV to 1.1 eV; a second subcell comprising a second base layer overlying the first subcell, wherein the second base layer comprises an alloy of elements from group III on the periodic table, nitrogen, arsenic, and at least one element selected from Sb and Bi, and characterized by a band gap of 0.9 eV to 1.3 eV; a third subcell comprising a third base layer overlying the second subcell, wherein the third base layer comprises a material selected from GaInPAs, (Al,In)GaAs and an alloy of elements from group III on the periodic table, nitrogen, arsenic, and at least one element selected from Sb and Bi, and characterized by a band gap of 1.1 eV to 1.5 eV; a fourth subcell comprising a fourth base layer overlying the third subcell, the fourth base layer comprising a material selected from (Al,In)GaAs and (Al)InGa(P)As, and characterized by a band gap from 1.4 eV to 1.7 eV; a fifth subcell comprising a fifth base layer overlying the fourth subcell, the fifth base layer comprising a material selected from (Al)InGaP and Al(In)Ga(P)As, and characterized by a band gap from 1.6 eV to 2.0 eV; and a sixth subcell comprising a sixth base layer overlying the fifth subcell, the sixth base layer comprising (Al)InGaP, and characterized by a band gap from 1.9 eV to 2.3 eV.

In certain embodiments of a photovoltaic cell comprising six subcells, one or more of the first base layer, the second base layer, and the third base layer comprise the alloy $Ga_{1-x}In_xN_yAs_{1-y-z}Sb_z$, in which values for x, y and z are $0 \le x \le 0.24$, $0.001 \le y \le 0.07$ and $0.001 \le z \le 0.20$. In certain of such embodiments, one or more of the first base layer, the second base layer, and the third base layer comprise the alloy $Ga_{1-x}In_xN_yAs_{1-y-z}Sb_z$, in which values for x, y and z are $0.01 \le x \le 0.18$, $0.005 \le y \le 0.05$, and $0.001 \le z \le 0.03$.

In one embodiment of the invention, a photovoltaic power system comprises one or more of a photovoltaic cell provided by the present disclosure such as, for example, one or more photovoltaic cells having at least four subcells, including one or more III-AsNV subcells. In one specific embodiment, the one or more photovoltaic cells has a III-AsNV subcell as the bottom subcell or the subcell immediately above the bottom subcell. In certain embodiments, the photovoltaic power system may be a concentrating photovoltaic system, wherein the system may also comprise mirrors and/or lenses used to concentrate sunlight onto one or more photovoltaic cells. In certain embodiments, the photovoltaic power system comprises a single or dual axis tracker. In certain embodiments, the photovoltaic power system is designed for portable applications, and in other embodiments, for grid-connected power generation. In certain embodiments, the photovoltaic power system is designed to convert a specific spectrum of light, such as AM1.5G, AM1.5D or AM0, into electricity. In certain embodiments, the photovoltaic power system may be found on satellites or other extra-terrestrial vehicles and designed for operation in space without the influence of a planetary atmosphere on the impinging light source. In certain embodiments, the photovoltaic power system may be designed for operation on astronomical bodies other than Earth. In certain embodiments, the photovoltaic power system may be designed for satellites orbiting about astronomical bodies other than Earth. In certain embodiments, the photovoltaic power system may be designed for roving on the surface of an astronomical body other than Earth.

In certain embodiments of the invention, photovoltaic modules are provided comprising one or more photovoltaic cells provided by the present disclosure. A photovoltaic module may comprise one or more photovoltaic cells provided by the present disclosure to include an enclosure and interconnects to be used independently or assembled with additional modules to form a photovoltaic power system. A module and/or power system may include power conditioners, power converters, inverters and other electronics to convert the power generated by the photovoltaic cells into usable electricity. A photovoltaic module may further include optics for focusing light onto a photovoltaic cell provided by the present disclosure such as in a concentrated photovoltaic module.

In one embodiment of the invention, the semiconductor layers composing the solar cell, excepting the substrate, are fabricated using molecular beam epitaxy (MBE) or chemical vapor deposition. In certain embodiments, more than one material deposition chamber is used for the deposition of the semiconductor layers comprising the solar cell. The materials deposition chamber is the apparatus in which the semiconductor layers composing the solar cell are deposited. The conditions inside the chamber may range from $10^{-11}$ Torr to $10^3$ Torr pressures. In certain embodiments the alloy constituents are deposited via physical and/or chemical processes. Each materials deposition chamber can have different configurations which allow it to deposit different semiconductor layers and can be independently controlled from other materials deposition chambers. The semiconductor layers may be fabricated using metal organic chemical vapor deposition (MOCVD), MBE, or by other methods, including a combination of any of the foregoing.

The movement of the substrate and semiconductor layers from one materials deposition chamber to another is defined as the transfer. For example, a substrate is placed in a first materials deposition chamber, and then the buffer layer(s) and the bottom subcell(s) are deposited. Then the substrate and semiconductor layers are transferred to a second materials deposition chamber where the remaining subcells are deposited. The transfer may occur in vacuum, at atmospheric pressure in air or another gaseous environment, or in any environment in between. The transfer may further be between materials deposition chambers in one location, which may or may not be interconnected in some way, or may involve transporting the substrate and semiconductor layers between different locations, which is known as transport. Transport may be done with the substrate and semiconductor layers sealed under vacuum, surrounded by nitrogen or another gas, or surrounded by air. Additional semiconductor, insulating or other layers may be used as surface protection during transfer or transport, and removed after transfer or transport before further deposition.

In one embodiment of the invention, a plurality of layers is deposited on a substrate in a first materials deposition chamber. The plurality of layers may include etch stop layers, release layers (i.e., layers designed to release the semiconductor layers from the substrate when a specific process sequence, such as chemical etching, is applied), contact layers such as lateral conduction layers, buffer layers, or other semiconductor layers. In one specific embodiment, the sequence of layers deposited is buffer layer(s), then release layer(s), and then lateral conduction or contact layer(s). Next the substrate is transferred to a second materials deposition chamber where one or more subcells are deposited on top of the existing semiconductor layers. The substrate may then be transferred to either the first materials deposition chamber or to a third materials deposition chamber for deposition of one or more subcells and then deposition of one or more contact layers. Tunnel junctions are also formed between the subcells.

In one embodiment of the invention, the III-AsNV subcells are deposited in a first materials deposition chamber, and the (Al)InGaP, (Al,In)GaAs and (Al)GaInPAs subcells are deposited in a second materials deposition chamber, with tunnel junctions formed between the subcells. In a related embodiment of the invention, III-AsNV layers are deposited in a first materials deposition chamber, and other semiconductor layers that contain Al are deposited in a second materials deposition chamber. In another embodiment of the invention, a transfer occurs in the middle of the growth of one subcell, such that the said subcell has one or more layers deposited in one materials deposition chamber and one or more layers deposited in a second materials deposition chamber.

In one embodiment of the invention, some or all of the layers composing the III-AsNV subcells and the tunnel junctions are deposited in one materials deposition chamber by molecular beam epitaxy, and the remaining layers of the solar cell are deposited by chemical vapor deposition in another materials deposition chamber. For example, a substrate is placed in a first materials deposition chamber and layers that may include nucleation layers, buffer layers, emitter and window layers, contact layers and a tunnel junction are grown on the substrate, followed by one or more III-AsNV subcells. If there is more than one III-AsNV subcell, then a tunnel junction is grown between adjacent subcells. One or more tunnel junction layers may be grown, and then the substrate is transferred to a second materials deposition chamber where the remaining solar cell layers are grown by chemical vapor deposition. In certain embodiments, the chemical vapor deposition system is a MOCVD system. In a related embodiment of the invention, a substrate is placed in a first materials deposition chamber and layers that may include nucleation layers, buffer layers, emitter and window layers, contact layers and a tunnel junction are grown on the substrate by chemical vapor deposition. Subsequently, the top subcells, two or more, are grown on the existing semiconductor layers, with tunnel junctions grown between the subcells. Part of the topmost III-AsNV subcell, such as the window layer, may then be grown. The substrate is then transferred to a second materials deposition chamber where the remaining semiconductor layers of the topmost III-AsNV subcell may be deposited, followed by up to three more III-AsNV subcells, with tunnel junctions between them.

In certain embodiments of the invention, the solar cell is subjected to one or more thermal annealing treatments after growth. For example, a thermal annealing treatment includes the application of a temperature of 400° C. to 1000° C. for between 10 seconds and 10 hours. Thermal annealing may be performed in an atmosphere that includes air, nitrogen, arsenic, arsine, phosphorus, phosphine, hydrogen, forming gas, oxygen, helium and any combination of the preceding materials. In certain embodiments, a stack of subcells and associated tunnel junctions may be annealed prior to fabrication of additional subcells.

Thus, methods of manufacturing a photovoltaic cell are provided, comprising: forming one or more semiconductor layers on a substrate; forming four or more subcells overlying the one or more semiconductor layers; and wherein at least one of the subcells has a base layer formed of an alloy of one or more elements from group III on the periodic table, nitrogen, arsenic, and at least one element selected from the group consisting of Sb and Bi; wherein the photovoltaic cell comprises at least four subcells and each of the at least four subcells is substantially lattice matched to each of the other subcells. In certain embodiments, the substrate is a subcell having a base layer formed of a material selected from the group consisting of Ge, SiGe(Sn), and an alloy of one or more elements from group III on the periodic table, nitrogen, arsenic, and at least one element selected from the group consisting of Sb and Bi. In certain embodiments, the methods comprise forming tunnel junctions between the four or more subcells.

In certain embodiments, methods of manufacturing a photovoltaic cell comprise: forming a first subcell having a first base layer formed of a material selected from the group consisting of Ge, SiGe(Sn), and an alloy of one or more elements from group III on the periodic table, nitrogen, arsenic, and at least one element selected from the group consisting of Sb and Bi, wherein the first subcell is characterized by a band gap from 0.7 eV to 1.1 eV; forming a second subcell having a second base layer, wherein the second base layer is formed of an alloy of one or more elements from group III on the periodic table, nitrogen, arsenic, and at least one element selected from the group consisting of Sb and Bi, wherein the second subcell is characterized by a band gap from 0.9 eV to 1.3 eV; and forming at least two additional subcells overlying the second subcell; wherein the photovoltaic cell comprises at least four subcells and each of the at least four subcells is substantially lattice matched to each of the other subcells. In certain methods, each of the at least four subcells is substantially lattice matched to a material selected from the group consisting of Si, Ge, SiGe, GaAs, and InP. In certain methods, the first base layer formed of an alloy $Ga_{1-x}In_xN_yAs_{1-y-z}Sb_z$, in which values for x, y and z are $0.02 \leq x \leq 0.24$, $0.015 \leq y \leq 0.07$ and $0.001 \leq z \leq 0.03$; and the second base layer formed of an alloy $Ga_{1-x}In_xN_yAs_{1-y-z}Sb_z$, in which values for x, y and z are $0 \leq x \leq 0.18$, $0.005 \leq y \leq 0.05$ and $0.001 \leq z \leq 0.03$. In certain methods, forming at least two additional subcells overlying the second subcell comprises: forming a third subcell having a third base layer is overlying the second subcell, wherein the third base layer is formed of a material selected from the group consisting GaInPAs and (Al,In)GaAs, and characterized by a band gap from 1.4 eV to 1.7 eV; and forming a fourth subcell having a fourth base layer overlying the third subcell, wherein the fourth base layer is formed of (Al)InGaP, and characterized by a band gap from 1.9 eV to 2.2 eV.

In certain embodiments, methods of manufacturing a photovoltaic cell comprise: forming at least two subcells on a substrate; forming a first subcell having a first base layer, wherein the first base layer is formed of an alloy of one or more elements from group III on the periodic table, nitrogen, arsenic, and at least one element selected from the group consisting of Sb and Bi, wherein the first subcell is characterized by a band gap from 0.9 eV to 1.3 eV; and forming a second subcell having a second base layer formed of a material selected from the group consisting of Ge, SiGe(Sn), and an alloy of one or more elements from group III on the periodic table, nitrogen, arsenic, and at least one element selected from the group consisting of Sb and Bi, wherein the second subcell is characterized by a band gap from 0.7 eV to 1.1 eV; wherein the photovoltaic cell comprises at least four subcells and each of the at least four subcells is substantially lattice matched to each of the other subcells.

In certain embodiments, methods of manufacturing a photovoltaic cell comprise: forming one or more subcells on a substrate in a first materials deposition chamber; transferring the substrate to a second materials deposition chamber; and forming one or more additional subcells overlying the one or more subcells; and wherein one or more of the subcells of the photovoltaic cell has a base layer formed of an alloy of one or more elements from group III on the periodic table, nitrogen, arsenic, and at least one element selected from the group consisting of Sb and Bi; and wherein each of the subcells is substantially lattice matched to each of the other subcells. In certain embodiments, methods of manufacturing a photovoltaic cell further comprise: forming one or more layers selected from the group consisting of a buffer layer, a contact layer, an etch stop layer, a release layer, and other semiconductor layer on the substrate in a chamber selected from the group consisting of a third materials deposition chamber and the second materials chamber; and transferring the substrate to the first materials deposition chamber.

Figure 17A:
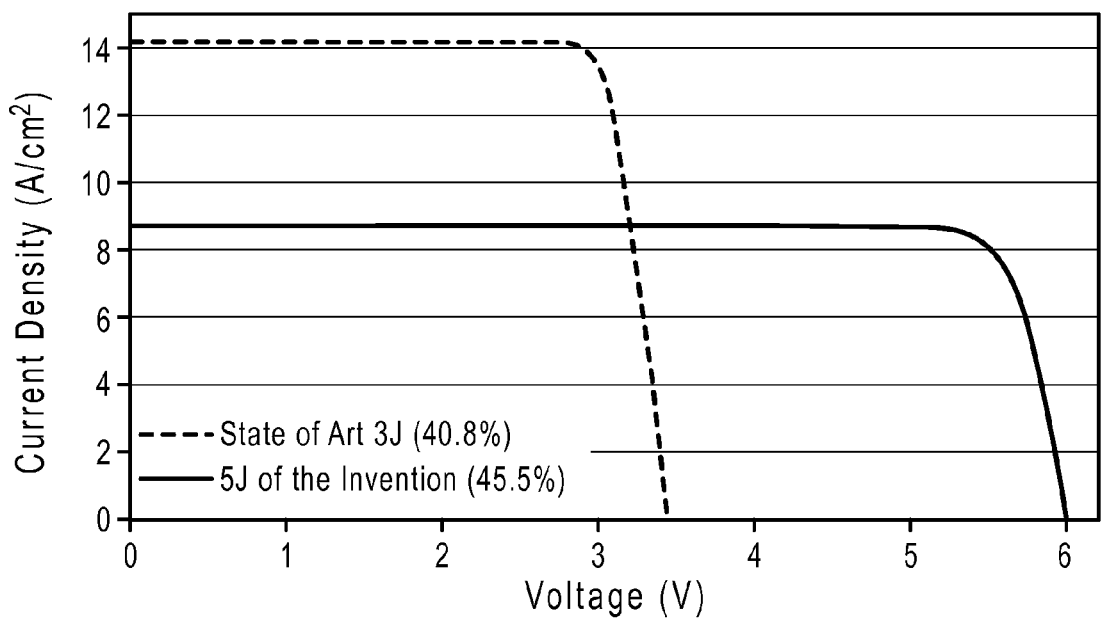
FIG. 17A shows current-voltage curves for the multijunction solar cell with five subcells according to the invention compared to a state-of-the-art multijunction solar cell with three subcells.
Figure 17B:
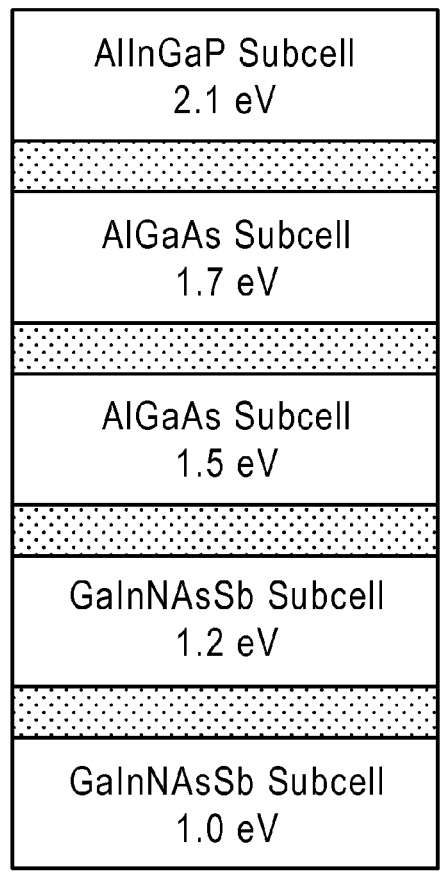
FIG. 17B depicts a schematic cross section of a multijunction solar cell with five subcells illustrating still another example of the embodiment of the invention depicted in FIG. 7.

A more specific example of the embodiment illustrated by FIG. 7 is the five junction solar cell depicted in FIG. 17B. The bottom subcell is a GaInNAsSb subcell with a band gap of 1.0 eV and a total subcell thickness of 2-3 microns. J4 is a GaInNAsSb subcell with a band gap of 1.2 eV and a total subcell thickness of 2-3 microns. J3 is an AlGaAs subcell with a band gap of 1.5 eV and a total subcell thickness of 4-5 microns. J2 is an AlGaAs subcell with a band gap of 1.7 eV and a subcell thickness of 4-5 microns. J1 is an AlInGaP subcell with a band gap of 2.1 eV and a subcell thickness of 0.3-1.0 microns. The upper two tunnel junctions comprise GaAs:Si/AlGaAs:C, each with a total thickness of approximately 15 nm to 25 nm. The lower two tunnel junctions are GaAs:Si/GaAs:C, each with total thickness between 40 and 100 nm. All of the subcells are substantially lattice-matched to a GaAs substrate. The solar cell undergoes a thermal anneal after growth and before device processing, and an additional thermal anneal during device processing.

An I-V curve of the simulated current output as a function of voltage of the multijunction solar cell shown in FIG. 17B at 1000 suns under the AM1.5D spectrum at 25° C. is shown in FIG. 17A, along with the performance of the state-of-the-art high efficiency triple-junction solar cell described herein. The two solar cells have bottom GaInNAsSb subcells with the same band gap. The simulated efficiency of the five junction solar cell according to certain embodiments is 45.5%, compared to 40.8% for the triple junction solar cell. While the achievable current at this solar concentration is lower for the five-junction solar cell compared to the three junction solar cell, the voltage is substantially higher. The higher efficiency is achieved because much less of the incident light energy is being lost as heat. More photons are absorbed by subcells with band gaps closer to their energies, allowing more of the energy to be converted into electricity and less into heat.

Figure 18A:
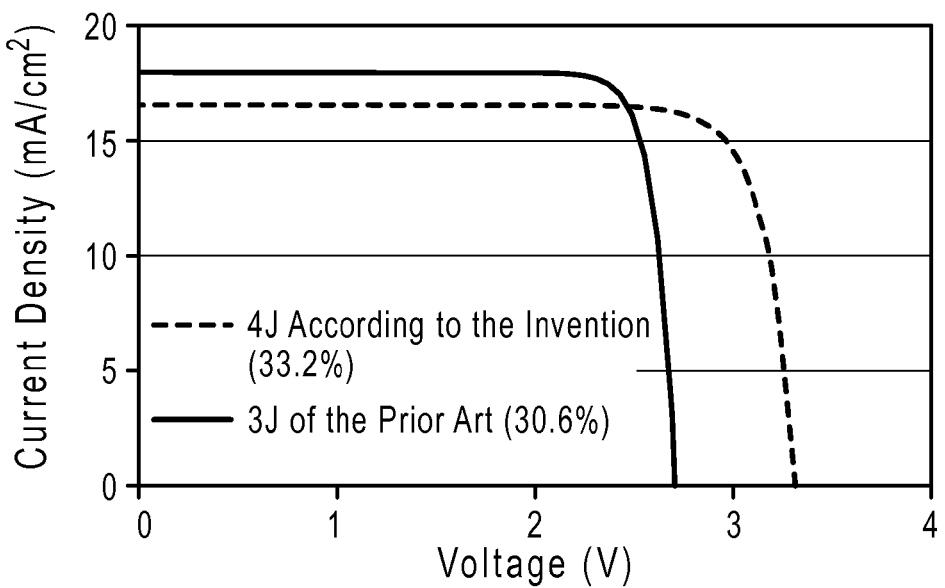
FIG. 18A shows current-voltage curves for the multijunction solar cell with four subcells according to the invention compared to a state-of-the-art multijunction solar cell with three subcells measured under the AM0 spectrum.
Figure 18B:
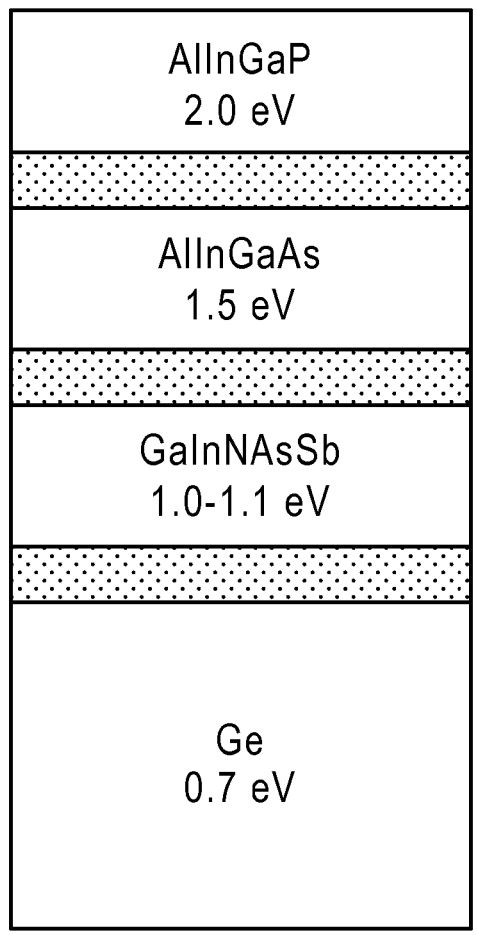
FIG. 18B shows the solar cell with four subcells for which the simulation depicted in FIG. 18A was produced.
Figure 19A:
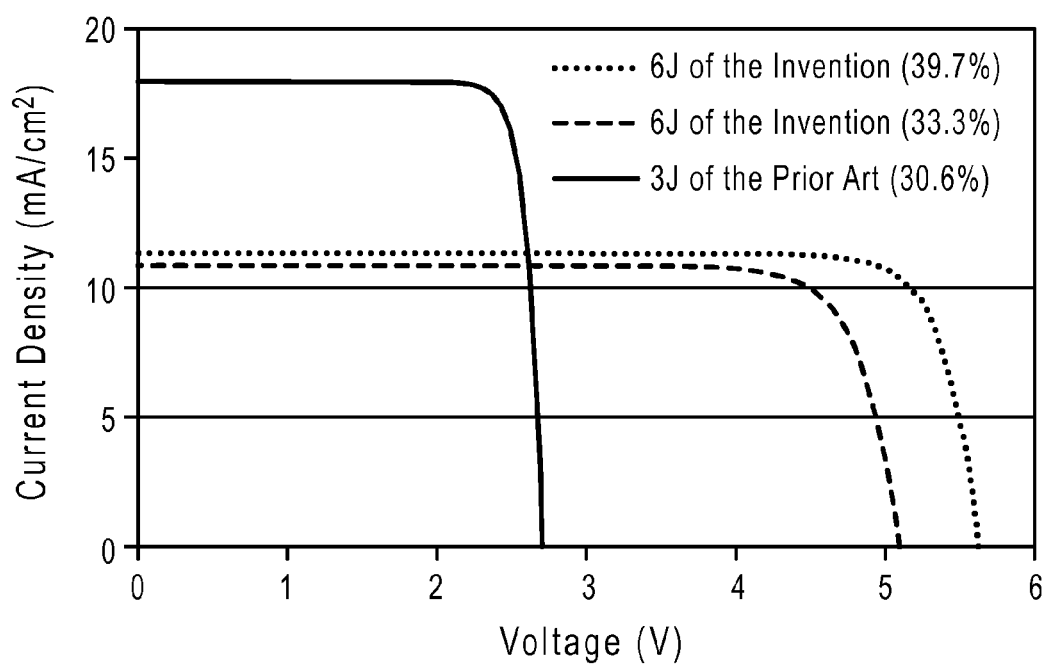
FIG. 19A shows current-voltage curves for the multijunction solar cell with six subcells according to the invention compared to a state-of-the-art multijunction solar cell with three subcells measured under the AM0 spectrum.
Figure 19B:
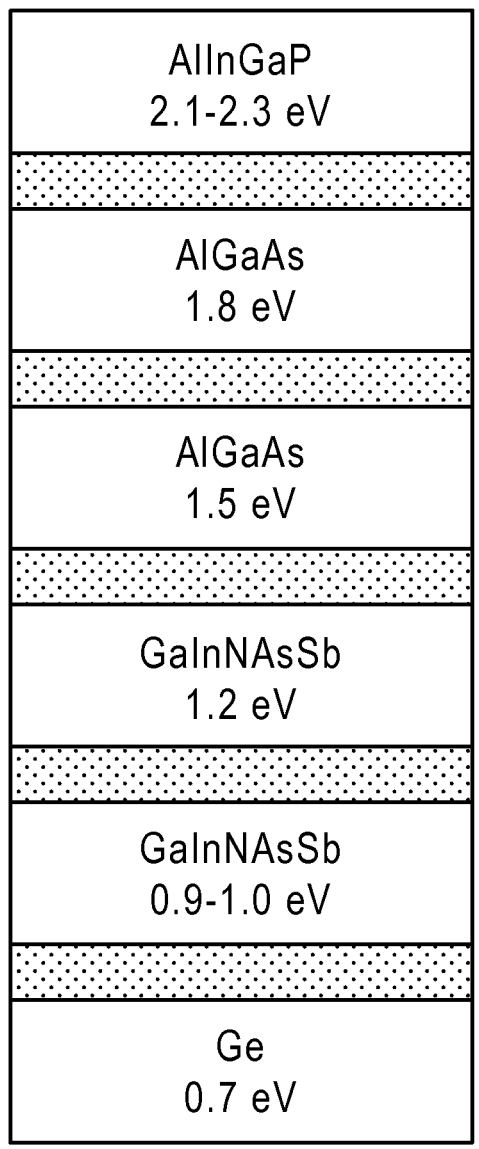
FIG. 19B shows the solar cell with six subcells for which the simulation depicted in FIG. 19A was produced.

An I-V curve of the simulated current output as a function of voltage of the multijunction solar cell shown in FIG. 18B, a four junction solar cell disclosed by the invention, under the AM0 spectrum at 1 sun at 25° C. is shown in FIG. 18A, along with the simulated performance of the typical InGaP/InGaAs/Ge triple junction solar cell found on the market today for use in space. The simulated efficiency of the four-junction solar cell disclosed by the invention is 33.2%, compared to 30.6% for the triple junction solar cell. While the achievable current is lower for the four junction solar cell compared to the three junction solar cell, the voltage is substantially higher. I-V curves for the six junction solar cell disclosed by the invention and shown in FIG. 19B under the AM0 spectrum at 25° C. are shown in FIG. 19A, along with the performance of the state-of-the-art triple junction solar cell described above. Shown is both the data for a six junction cell made today, as well as the data for a future cell with improved minority carrier properties. The simulated efficiencies of the current and future six junction solar cells of the invention are 33.3% and 39.7%, respectively, compared to 30.6% for today's triple junction solar cell. While the achievable current is lower for the six junction solar cells compared to the three junction solar cell, the voltage is approximately double that of the triple junction solar cell. In both FIGS. 18A and 19A, similar to the terrestrial multijunction solar cell, the higher efficiency is achieved because much less of the incident light energy is being lost as heat. More photons are absorbed by subcells with band gaps closer to their energies, allowing more of the energy to be converted into electricity and less into heat.

Various values for band gaps have been recited in the description and in the claims. It should be understood that these values are not exact. However, the values for band gaps are approximated to one significant figure to the right of the decimal point, except where otherwise indicated. Thus, the value 0.9 covers the range 0.850 to 0.949.

The invention has been explained with reference to specific embodiments. Other embodiments will be evident to those of ordinary skill in the art. It is therefore not intended for the invention to be limited, except as indicated by the appended claims.

What is claimed is:

1. A method of manufacturing a photovoltaic cell, comprising:
   forming one or more semiconductor layers on a substrate; and
   forming four or more subcells overlying the one or more semiconductor layers; and
   wherein at least one of the subcells has a base layer formed of $Ga_{1-x}In_xN_yAs_{1-y-z}Sb_z$, in which values for x, y and z are $0.08 \leq x \leq 0.24$, $0.02 \leq y \leq 0.05$, and $0.001 \leq z \leq 0.02$;
   wherein each of the four or more subcells is substantially lattice matched to each of the other subcells.

2. The method of claim 1, comprising forming tunnel junctions between each of the four or more subcells.

3. The method of claim 1, wherein the substrate is selected from the group consisting of Si, Ge, GaAs, and InP.

4. The method of claim 1, wherein the at least one subcell is characterized by a bandgap selected from the group consisting of 0.7 eV to 1.1 eV, 0.8 to 0.9 eV, 0.9 eV to 1.0 eV, 0.9 eV to 1.3 eV, 1.0 eV to 1.1 eV, 1.0 eV to 1.2 eV, 1.1 eV to 1.2 eV, 1.1 eV to 1.4 eV, and 1.2 eV to 1.4 eV.

5. The method of claim 1, wherein a base layer of another one of the at least four subcells is formed of $Ga_{1-x}In_xN_yAs_{1-y-z}Sb_z$, in which values for x, y and z are $0 \leq x \leq 0.24$, $0.001 \leq y \leq 0.07$ and $0.001 \leq z \leq 0.20$.

6. The method of claim 1, wherein a base layer of another one of the at least four subcells is formed of $Ga_{1-x}In_xN_yAs_{1-y-z}Sb_z$, in which values for x, y and z are $0.01 \leq x \leq 0.18$, $0.005 \leq y \leq 0.05$, and $0.001 \leq z \leq 0.03$.

7. The method of claim 1, wherein the at least one subcell with a base layer formed of $Ga_{1-x}In_xN_yAs_{1-y-z}Sb_z$ has a compressive strain of less than 0.6%.

8. The method of claim 1, wherein
   the at least one subcell is a first subcell with a base layer formed of $Ga_{1-x}In_xN_yAs_{1-y-z}Sb_z$, in which values for x, y and z are $0.08 \leq x \leq 0.24$, $0.02 \leq y \leq 0.05$, and $0.001 \leq z \leq 0.02$; and wherein a band gap of the subcell is between 0.7 and 1.1 eV; and
   a second subcell has a base layer formed of an alloy of one or more elements from group III on the periodic table, nitrogen, arsenic, and at least one element selected from the group consisting of Sb and Bi, and wherein a band gap of the second subcell is greater than the band gap of the first subcell.

9. The method of claim 8, wherein
   the first subcell is characterized by a first band gap of 0.9 eV to 1.0 eV; and
   the second subcell is characterized by a second band gap of 1.1 eV to 1.2 eV.

10. The method of claim 8, wherein the second subcell has a base layer formed of a material selected from the group consisting of GaInNAsSb, GaInNAsBi, GaInNAsSbBi, GaNAsSb, GaNAsBi, and GaNAsSbBi.

11. The method of claim 1, wherein forming the four or more subcells comprises:
    forming a first subcell having a first base layer formed of a material selected from the group consisting of Ge, SiGe (Sn), and $Ga_{1-x}In_xN_yAs_{1-y-z}Sb_z$, in which values for x, y and z are $0.08 \leq x \leq 0.24$, $0.02 \leq y \leq 0.05$ and $0.001 \leq z \leq 0.02$, wherein the first subcell is characterized by a band gap from 0.7 eV to 1.1 eV;

forming a second subcell having a second base layer, wherein the second base layer is formed of an alloy of one or more elements from group III on the periodic table, nitrogen, arsenic, and at least one element selected from the group consisting of Sb and Bi, wherein the second subcell is characterized by a band gap from 0.9 eV to 1.3 eV; and forming at least two additional subcells overlying the second subcell;

wherein the photovoltaic cell comprises at least four subcells and each of the at least four subcells is substantially lattice matched to each of the other subcells; and wherein the first base layer, the second base layer, or the first base layer and the second base layer are formed of $Ga_{1-x}In_xN_yAs_{1-y-z}Sb_z$, in which values for x, y and z are $0.08 \leq x \leq 0.24$, $0.02 \leq y \leq 0.05$ and $0.001 \leq z \leq 0.02$.

12. The method of claim 11, wherein each of the at least four subcells is substantially lattice matched to a material selected from the group consisting of Si, Ge, SiGe, GaAs, and InP.

13. The method of claim 11, wherein the first base layer is formed of an alloy $Ga_{1-x}In_xN_yAs_{1-y-z}Sb_z$, in which values for x, y and z are $0.08 \leq x \leq 0.24$, $0.02 \leq y \leq 0.05$ and $0.001 \leq z \leq 0.02$; and the second base layer is formed of $Ga_{1-x}In_xN_yAs_{1-y-z}Sb_z$, in which values for x, y and z are $0 \leq x \leq 0.24$, $0.001 \leq y \leq 0.07$ and $0.001 \leq z \leq 0.20$.

14. The method of claim 11, wherein forming at least two additional subcells overlying the second subcell comprises:

forming a third subcell having a third base layer is overlying the second subcell, wherein the third base layer is formed of a material selected from the group consisting GaInPAs and (Al,In)GaAs, and characterized by a band gap from 1.4 eV to 1.7 eV; and forming a fourth subcell having a fourth base layer overlying the third subcell, wherein the fourth base layer is formed of (Al)InGaP, and characterized by a band gap from 1.9 eV to 2.2 eV.

15. A method of manufacturing a photovoltaic cell, comprising:

forming at least two subcells on a substrate;

forming a first subcell having a first base layer, wherein the first base layer is formed of $Ga_{1-x}In_xN_yAs_{1-y-z}Sb_z$, in which values for x, v and z are $0.08 \leq x \leq 0.24$, $0.02 \leq v \leq 0.05$ and $0.001 \leq z \leq 0.02$, wherein the first subcell is characterized by a band gap from 0.7 eV to 1.1 eV; and forming a second subcell having a second base layer formed of $Ga_{1-x}In_xN_yAs_{1-y-z}Sb_z$, in which values for x, y and z are $0 \leq x \leq 0.24$, $0.001 \leq y \leq 0.07$ and $0.001 \leq z \leq 0.20$ overlying the first subcell, wherein the second subcell is characterized by a band gap from 0.9 eV to 1.3 eV;

wherein each of the at least two subcells is substantially lattice matched to each of the other subcells.

16. A method of manufacturing a photovoltaic cell, comprising:

forming one or more subcells on a substrate in a first materials deposition chamber; transferring the substrate to a second materials deposition chamber; and forming one or more additional subcells overlying the one or more subcells; and wherein one or more of the subcells of the photovoltaic cell has a base layer formed of $Ga_{1-x}In_xN_yAs_{1-y-z}Sb_z$, in which values for x, y and z are $0.08 \leq x \leq 0.24$, $0.02 \leq y \leq 0.05$ and $0.001 \leq z \leq 0.02$; and wherein each of the one or more subcells is substantially lattice matched to each of the other subcells.

17. The method of claim 16, wherein molecular beam epitaxy is used to deposit a base layer of each of the one or more subcells.

18. The method of claim 16, comprising:

forming one or more layers selected from the group consisting of a buffer layer, a contact layer, an etch stop layer, a release layer, and other semiconductor layer on the substrate in a chamber selected from the group consisting of a third materials deposition chamber and the second materials deposition chamber; and transferring the substrate to the first materials deposition chamber.

19. The method of claim 16, wherein the substrate is selected from the group consisting of Si, Ge, GaAs, and InP.

20. The method of claim 1, wherein the at least one subcell is characterized by a thickness from 2 μm to 3 μm.

21. The method of claim 1, wherein the at least one subcell is characterized by a thickness from 1.5 μm to 3.5 μm.

22. The method of claim 1, wherein the values for x, y and z are $0.08 \leq x \leq 0.24$, $0.02 \leq y \leq 0.05$, and $0.001 \leq z \leq 0.02$.

* * * * *